(12) United States Patent
Park et al.

(10) Patent No.: US 10,910,275 B2
(45) Date of Patent: Feb. 2, 2021

(54) SEMICONDUCTOR DEVICE AND METHOD OF FABRICATING THE SAME

(71) Applicant: Samsung Electronics Co., Ltd., Suwon-si (KR)

(72) Inventors: Gi Gwan Park, Hwaseong-si (KR); Jung Gun You, Ansan-si (KR); Ki Il Kim, Suwon-si (KR); Sug Hyun Sung, Yongin-si (KR); Myung Yoon Um, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/599,313

(22) Filed: Oct. 11, 2019

(65) Prior Publication Data

US 2020/0043807 A1    Feb. 6, 2020

Related U.S. Application Data

(62) Division of application No. 15/292,790, filed on Oct. 13, 2016, now Pat. No. 10,475,707.

(30) Foreign Application Priority Data

Feb. 2, 2016  (KR) .......................... 10-2016-0012950
Mar. 22, 2016 (KR) .......................... 10-2016-0034018

(51) Int. Cl.
*H01L 21/8238* (2006.01)
*H01L 29/66* (2006.01)
(Continued)

(52) U.S. Cl.
CPC ............... *H01L 21/823821* (2013.01); *H01L 21/76224* (2013.01); *H01L 21/823431* (2013.01);
(Continued)

(58) Field of Classification Search
CPC ..... H01L 21/823431; H01L 21/823481; H01L 21/823821; H01L 21/823828;
(Continued)

(56) References Cited

U.S. PATENT DOCUMENTS

| 7,508,048 B2 | 3/2009 | Kang et al. |
| 8,319,311 B2 | 11/2012 | Chen et al. |
| 8,329,514 B2 | 12/2012 | Min et al. |
| 8,704,310 B2 | 4/2014 | Aquilino et al. |

(Continued)

FOREIGN PATENT DOCUMENTS

| CN | 104347717 A | 2/2015 |
| KR | 100278883 B1 | 1/2001 |

(Continued)

OTHER PUBLICATIONS

Office Action for corresponding Chinese Patent Application No. 201710063704.7 dated Dec. 2, 2020.

*Primary Examiner* — Savitri Mulpuri
(74) *Attorney, Agent, or Firm* — Harness, Dickey & Pierce, P.L.C.

(57) ABSTRACT

A method of manufacturing a semiconductor device includes forming a first fin-type pattern and a second fin-type pattern which are separated by a first trench between facing ends thereof, forming a first insulating layer filling the first trench, removing a portion of the first insulating layer to form a second trench on the first insulating layer, and forming a third trench by enlarging a width of the second trench.

6 Claims, 21 Drawing Sheets

(51) Int. Cl.

| | |
|---|---|
| *H01L 27/092* | (2006.01) |
| *H01L 21/762* | (2006.01) |
| *H01L 21/8234* | (2006.01) |
| *H01L 29/78* | (2006.01) |
| *H01L 29/165* | (2006.01) |

(52) U.S. Cl.
CPC ............ *H01L 21/823437* (2013.01); *H01L 21/823481* (2013.01); *H01L 21/823828* (2013.01); *H01L 21/823878* (2013.01); *H01L 27/0924* (2013.01); *H01L 29/66545* (2013.01); *H01L 29/7848* (2013.01); *H01L 29/165* (2013.01)

(58) Field of Classification Search
CPC ......... H01L 29/66545; H01L 21/76224; H01L 27/0924; H01L 21/823437; H01L 29/7848; H01L 21/823878; H01L 29/165
See application file for complete search history.

(56) References Cited

U.S. PATENT DOCUMENTS

| | | |
|---|---|---|
| 8,853,817 B2 | 10/2014 | Wang |
| 8,878,309 B1 | 11/2014 | Hong et al. |
| 8,916,460 B1 | 12/2014 | Kwon et al. |
| 9,117,910 B2 | 8/2015 | Jeong et al. |
| 9,379,106 B2 | 6/2016 | Hong et al. |
| 9,646,967 B2 | 5/2017 | Kim |
| 9,755,074 B2 | 9/2017 | Chung et al. |
| 9,768,163 B2 | 9/2017 | Lee et al. |
| 2009/0212370 A1 | 8/2009 | Ikei |
| 2010/0062603 A1 | 3/2010 | Ganguly et al. |
| 2012/0309189 A1 | 12/2012 | Park et al. |
| 2013/0214392 A1 | 8/2013 | Kronholz et al. |
| 2015/0021695 A1 | 1/2015 | Hu et al. |
| 2015/0147860 A1 | 5/2015 | Kim et al. |
| 2017/0179284 A1 | 6/2017 | Kim et al. |

FOREIGN PATENT DOCUMENTS

| | | |
|---|---|---|
| KR | 20060005181 A | 1/2006 |
| KR | 20100055120 A | 5/2010 |
| KR | 101099516 B1 | 12/2011 |

SEMICONDUCTOR DEVICE AND METHOD OF FABRICATING THE SAME

CROSS-REFERENCE TO RELATED APPLICATIONS

This application is a divisional application of U.S. application Ser. No. 15/292,790, filed Oct. 13, 2016; which claims priority under 35 U.S.C. § 119 to Korean Patent Application No. 10-2016-0012950 filed on Feb. 2, 2016 and Korean Patent Application No. 10-2016-0034018 filed on Mar. 22, 2016 in the Korean Intellectual Property Office, the entire contents of each of which are incorporated herein by reference.

BACKGROUND

1. Technical Field

Some example embodiments of the inventive concepts relate to a semiconductor device and a method of fabricating the same.

2. Description of the Related Art

In order to increase the integration of a semiconductor device, multi-gate transistors, in which a fin-type multi-channel active pattern (or silicon body) is formed on a substrate, and a gate is formed on the surface of the multi-channel active pattern, have been proposed.

Since a multi-gate transistor uses a three-dimensional channel, it can typically be scaled. The multi-gate transistor can improve a current control capability even though the gate length of the multi-gate transistor is not increased. In addition, a short channel effect (SCE), where the electrical potential of the channel region is influenced by the drain voltage can be effectively reduced or suppressed.

SUMMARY

According to some example embodiments of the inventive concepts, a method of manufacturing a semiconductor device may include forming a first fin-type pattern and a second fin-type pattern which are arranged in a line, the first and second fin-type patterns including a long side and a short side, respectively, and separated by a first trench between the adjacent short sides of the first and second fin-type patterns, forming a first insulating layer to fill the first trench, forming a second trench on the first insulating layer by removing a portion of the first insulating layer, and forming a third trench by enlarging a width of the second trench.

According to example of the inventive concepts, a method of manufacturing a semiconductor device may include forming a first fin-type pattern and a second fin-type pattern which are arranged in a line, the first and second fin-type patterns including a long side and a short side, respectively, forming a field insulating layer between the short side of the first fin-type pattern and the short side of the second fin-type pattern, the field insulating layer exposing a portion of the first fin-type pattern and a portion of the second fin-type pattern, forming a first trench by removing the portion of the first fin-type pattern and the portion of the second fin-type pattern exposed by the field insulating layer, and forming a dummy gate electrode on the field insulating layer, the dummy gate electrode being between the first fin-type pattern and the second fin-type pattern.

According to some example embodiments of the inventive concepts, a method of manufacturing a semiconductor device may include forming a first fin-type pattern and a second fin-type pattern which are adjacent to each other in length directions thereof and are separated from each other by a first trench, in a first region of a substrate, forming a third fin-type pattern and a fourth fin-type pattern which are adjacent to each other in length directions thereof and are separated from each other by a second trench, in a second region of the substrate, forming a first insulating layer to fill the first trench and a second insulating layer to fill the second trench, forming a third trench by removing a portion of the first insulating layer, forming a fourth trench by enlarging a width of the third trench, and forming a fifth trench by removing a portion of the second insulating layer.

According to some example embodiments of the inventive concepts, a semiconductor device may include a first fin-type pattern and a second fin-type pattern which are separated from each other by a first recess between facing ends of the first and second fin-type patterns, an insulating pattern in the first recess, a first epitaxial pattern at an end portion of the first fin-type pattern, a second epitaxial pattern at an end portion of the second fin-type pattern, an insulating protrusion pattern on the insulating pattern, between the first epitaxial pattern and the second epitaxial pattern, and a conductive pattern on the insulating protrusion pattern and covering the insulating protrusion pattern. The first recess may include a first trench having a first width, a second trench having a second width greater than the first width and a connection portion between the first trench and the second trench. The connection portion may be rounded.

According to some example embodiments of the inventive concepts, a semiconductor device may include a first fin-type pattern and a second fin-type pattern which are separated from each other by a first recess between facing ends of the first and second fin-type patterns, an insulating pattern in the first recess, a first epitaxial pattern at an end portion of the first fin-type pattern, a second epitaxial pattern at an end portion of the second fin-type pattern. The first recess may include a first trench having a first width, a second trench having a second width greater than the first width, a third trench having a third width greater than the second width and a connection portion between the first and second trenches. The second trench may be connected to the first trench and the third trench. The connection portion may be rounded.

Some example embodiments relate to a method of manufacturing a semiconductor device including forming a first semiconductor material and a second semiconductor material in a longitudinal direction in a first region of the substrate, the first and second semiconductor materials being separated in the longitudinal direction by a first trench, forming a first insulating layer in the first trench, forming a second trench on the first insulating layer by removing a portion of the first insulating layer, and forming a third trench by enlarging a width of the second trench.

BRIEF DESCRIPTION OF THE DRAWINGS

The above and other example embodiments and features of the inventive concepts will become more apparent by describing in detail example embodiments thereof with reference to the attached drawings, in which.

DETAILED DESCRIPTION OF THE EMBODIMENTS

Various example embodiments will now be described more fully with reference to the accompanying drawings in which some example embodiments are shown. However, specific structural and functional details disclosed herein are merely representative for purposes of describing some example embodiments. Thus, the inventive concepts may be embodied in many alternate forms and should not be construed as limited to only example embodiments set forth herein.

Figure 1:
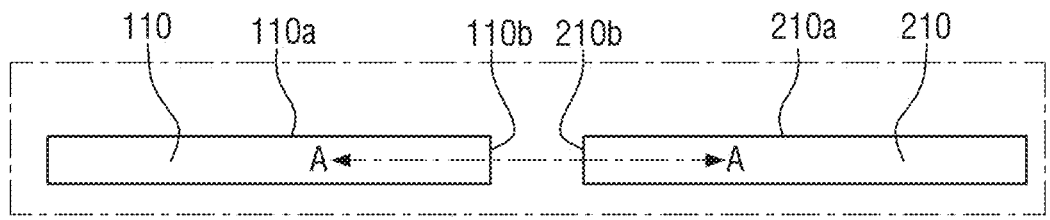
FIGS. 1 through 15C illustrate stages of a method of fabricating a semiconductor device according to some example embodiments of the inventive concepts.
Figure 1:
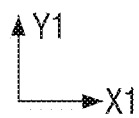
Figure 15A:
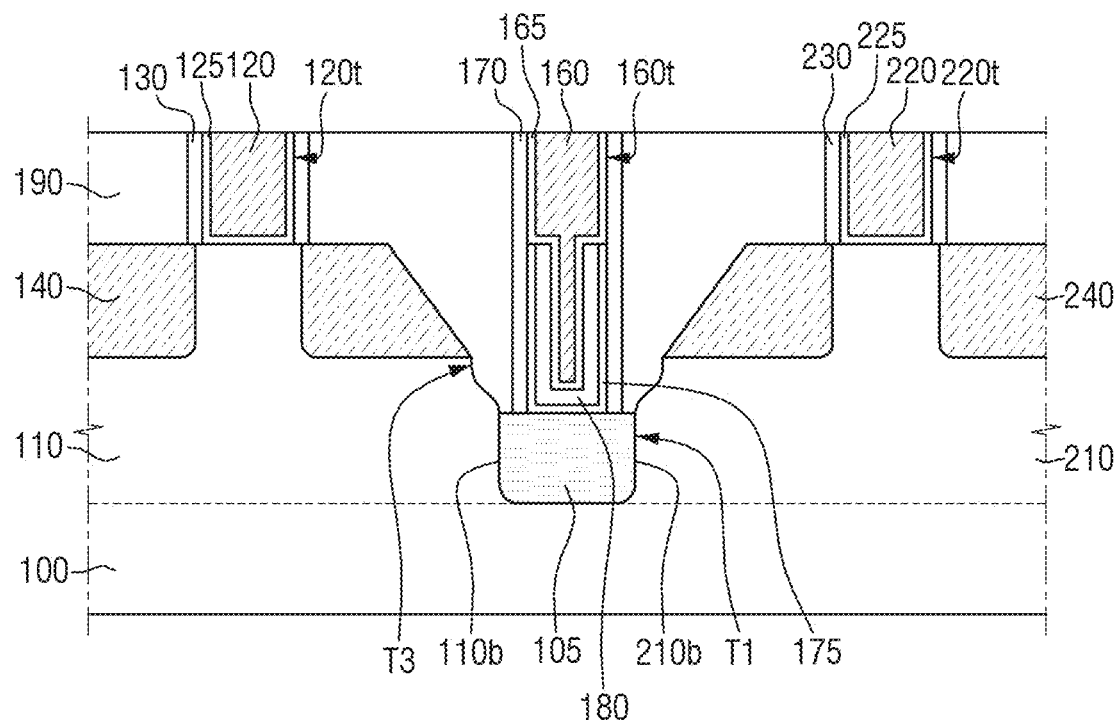
Figure 15B:
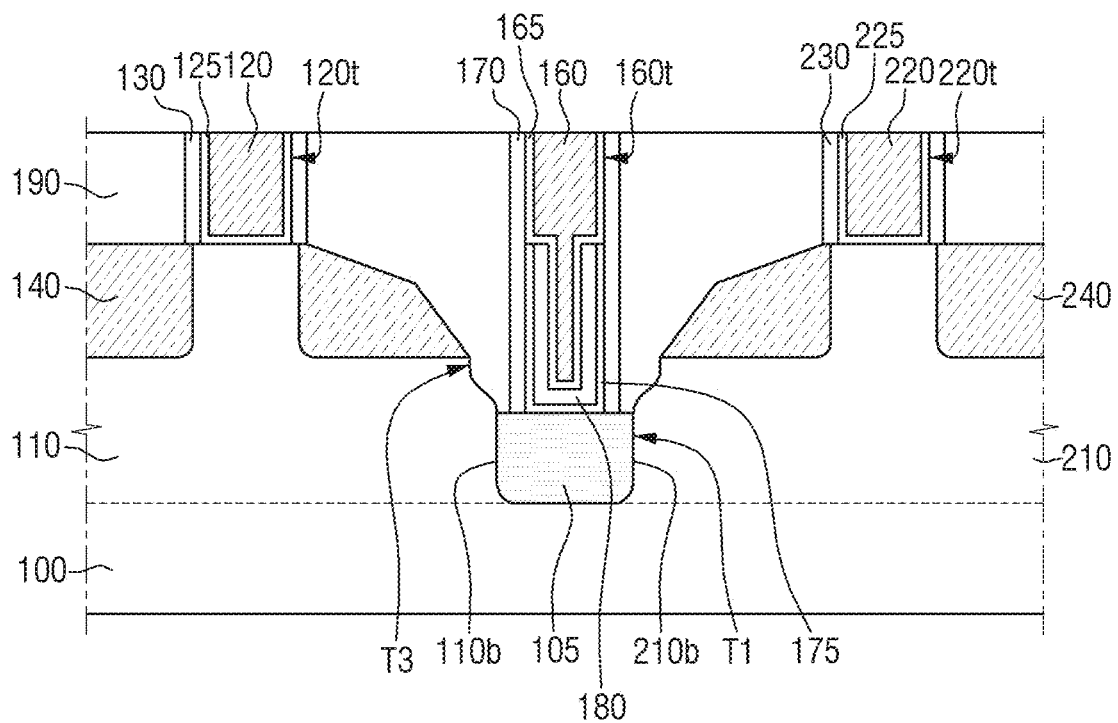
Figure 15C:
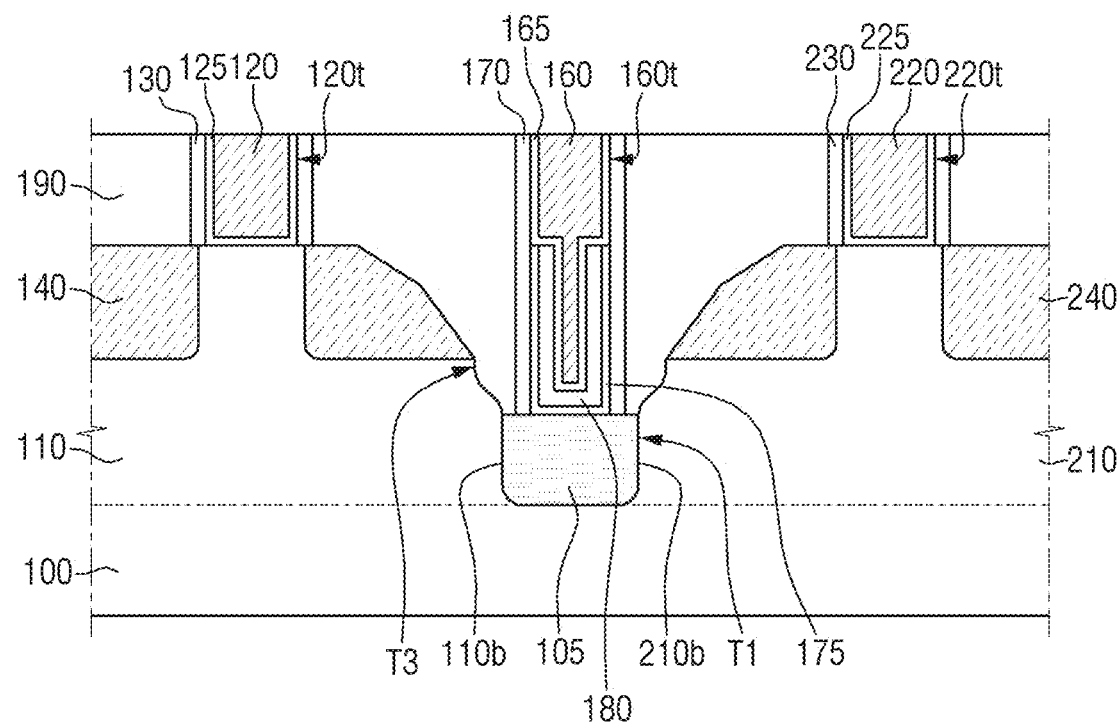

FIGS. 1 and 15C illustrate stages of a method of fabricating a semiconductor device according to some example embodiments of the inventive concepts.

Figure 2:
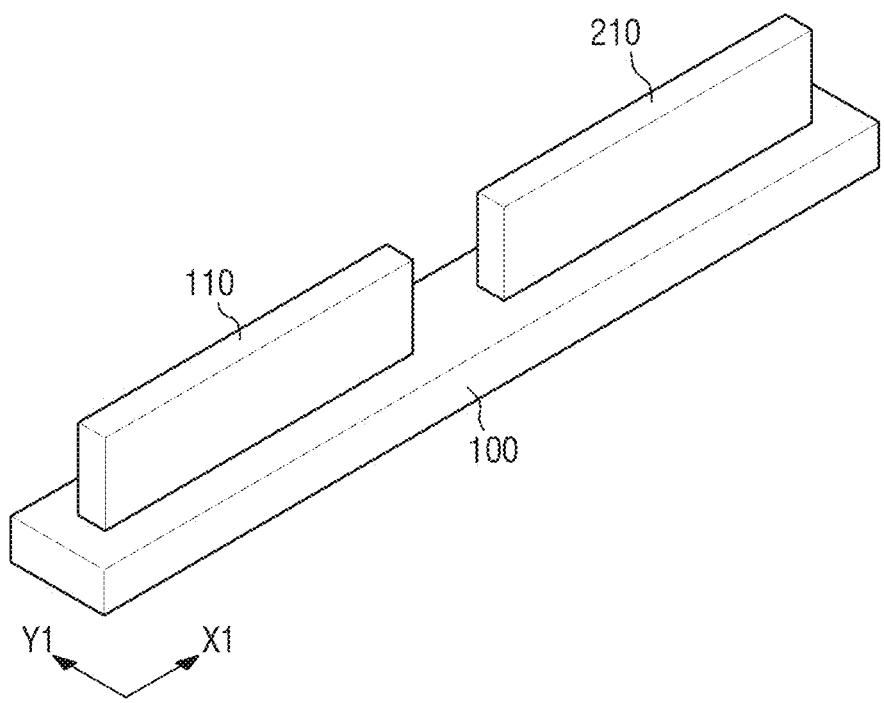
Figure 3:
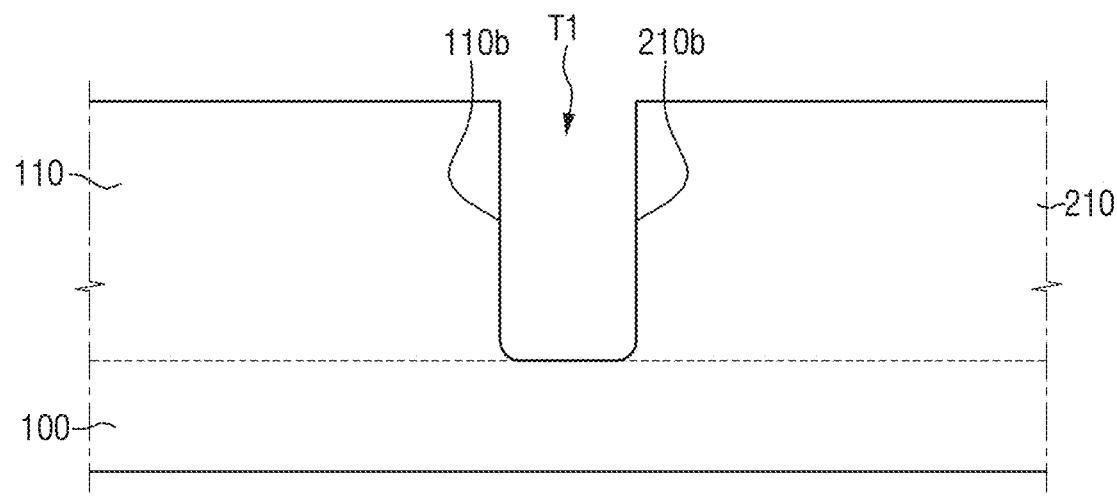

FIG. 1 is a plan view illustrating fin-type patterns, and FIG. 2 is a perspective view of FIG. 1. FIG. 3 is a cross-sectional view taken along line A-A of FIG. 1.

Although a fin field effect transistor (FinFET) having a channel region of the fin-type pattern is illustrated in drawings as an example, example embodiments of the inventive concepts are not limited thereto. The method of fabricating a semiconductor device according to some example embodiments of the inventive concepts may be used for fabricating a tunneling transistor, a transistor including a nanowire, a transistor including a nanosheet, a three dimensional (3D) transistor, a bipolar transistor, or a laterally diffused metal oxide transistor (LDMOS).

Referring to FIGS. 1 through 3, a first fin-type pattern 110 and a second fin-type pattern 210 may be formed on a substrate 100 to extend lengthwise in a first direction X1.

The substrate 100 may be, for example, a bulk silicon substrate or a silicon-on-insulator (SOI) substrate. Alternatively, the substrate 100 may include, for example, silicon-germanium, indium antimonide, indium arsenide, indium phosphide gallium arsenide, gallium antimonide, lead tellurium compound, or a silicon germanium on insulator (SGO), but not limited thereto. The substrate 100 may include a base substrate and an epitaxial layer formed thereon.

The first and second fin-type patterns 110 and 210 may be arranged in a line along the first direction X1. For example, the first fin-type pattern 110 and the second fin-type pattern 210 may extend in a line in a length direction of the first and second fin-type patterns 110 and 210. The first fin-type pattern 110 and the second fin-type pattern 210 may be adjacent to each other.

Since the first and second fin-type patterns 110 and 210 extend lengthwise in the first direction X1, the first fin-type pattern 110 may have a long side 110a extending along the first direction X1 and a short side 110b extending along a second direction Y1, and the second fin-type pattern 210 may have a long side 210a along the first direction X1 and a short side 210b extending along the second direction Y1. The second direction Y1 may be perpendicular to the first direction X1. The short side 110b of first fin-type pattern 110 may face the short side 210b of the second fin-type pattern 210. In other words, ends of the first and second fin-type patterns 110 and 210 may face each other.

Although top surfaces of the first and second fin-type patterns 110 and 210 are rounded, it will be understood by one of ordinary skill in the art that the long sides and the short sides of the first and second fin-type patterns 110 and 210 can be distinguished.

The first fin-type pattern 110 and the second fin-type pattern 210 may be separated by a first separation trench T1.

The first separation trench T1 may be formed between the first fin-type pattern 110 and the second fin-type pattern 210. For example, the short side 110b of the first fin-type pattern 110 and the short side 210b of the second fin-type pattern 210 may be defined by the first separation trench T1. The short side 110b of the first fin-type pattern 110 and the short side 210b of the second fin-type pattern 210 may contact the first separation trench T1.

Top surfaces of the first and second fin-type patterns 110 and 210 may be exposed, but not limited thereto. For example, a mask pattern used in a process of forming the first and second fin-type patterns 110 and 210 may remain on the top surfaces of the first and second fin-type patterns 110 and 210.

The first and second fin-type patterns 110 and 210 may be a portion of the substrate 100 as patterns which are formed by etching a portion of the substrate 100, or may include an epitaxial layer grown from the substrate 100.

The first and second fin-type patterns 110 and 210 may serve as an active region for a multi-gate transistor.

The first and second fin-type patterns 110 and 210 may include, for example, silicon, or germanium that is a semiconductor material. The first and second fin-type patterns 110 and 210 may include a semiconductor compound. For example, the semiconductor compound may include Iv-Iv group semiconductor compound or III-V group semiconductor compound.

More specifically, the IV-IV group semiconductor compound may include, for example, a binary compound, a ternary compound, or a binary compound doped with a group IV element, or a ternary compound doped with a group IV element, each or at least one of which contains at least two of carbon (C), silicon (Si), germanium (Ge), and tin (Sn).

The III-V group semiconductor compound may include, for example, a binary compound, a ternary compound, or a quaternary compound, each or at least one of which is formed by combination of a group III element, for example, at least one of aluminum (Al), gallium (Ga), and indium (In) and a group IV element, for example, one of phosphorus (P), arsenic (As), and antimony (Sb).

For convenience in explanation, in some example embodiments, it may be described that the first and second fin-type patterns 110 and 210 are silicon fin-type patterns.

Hereinafter, it will be described based on cross-sectional views taken along line A-A of FIG. 1.

Figure 4:
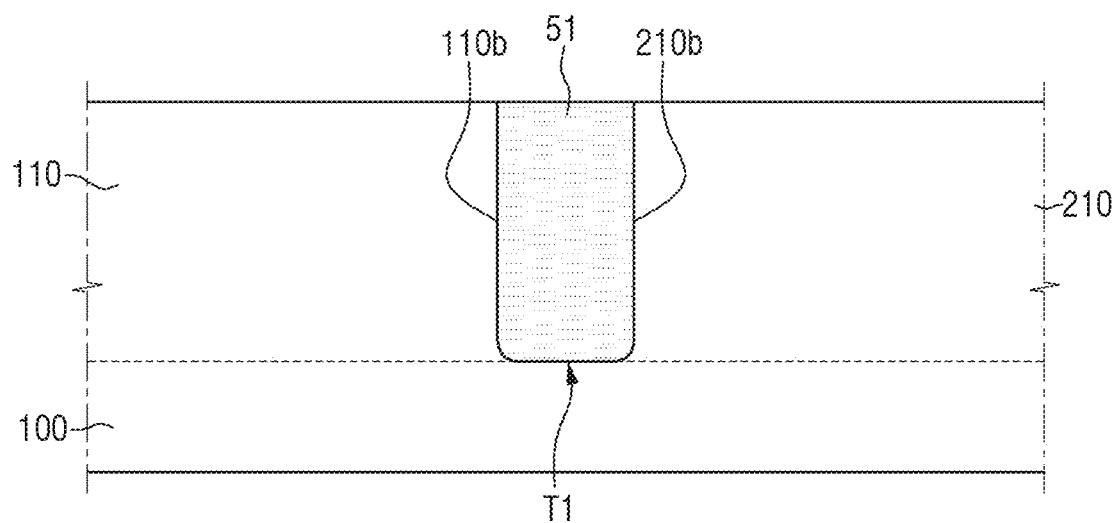

Referring to FIG. 4, a first insulating layer 51 may be formed to fill the first separation trench T1.

The first insulating layer 51 may be formed between the short side 110b of the first fin-type pattern 110 and the short side 210b of the second fin-type pattern 210 and may cover a sidewall (i.e., a sidewall including the short side 110b) of first fin-type pattern 110 and a sidewall (i.e., a sidewall including the short side 210b) of the second fin-type pattern 210.

The first insulating layer 51 may cover the long side 110a of the first fin-type pattern 110 and the long side 210a of the second fin-type pattern 210 shown in FIG. 2.

A top surface of the first insulating layer 51 may be substantially coplanar with the top surface of the first fin-type pattern 110 and the top surface of the second fin-type pattern 210, but not limited thereto.

The first insulating layer 51 may include, for example, a silicon oxide layer, a silicon nitride layer, a silicon oxy nitride layer, and/or a combination thereof. The first insulating layer 51 may include a low-k dielectric material of which a dielectric constant is less than the dielectric constant of silicon oxide, silicon nitride, or silicon oxynitride. The low-k dielectric material may include, for example, flowable oxide (FOX), torene silazene (TOSZ), undoped silica glass (USG), borosilica glass (BSG), phosphosilica glass (PSG), borophosphosilica glass (BPSG), plasma enhanced tetra ethyl ortho silicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SiLK, polyimide, porous polymeric material, and/or combinations thereof, but not limited thereto.

Figure 5:
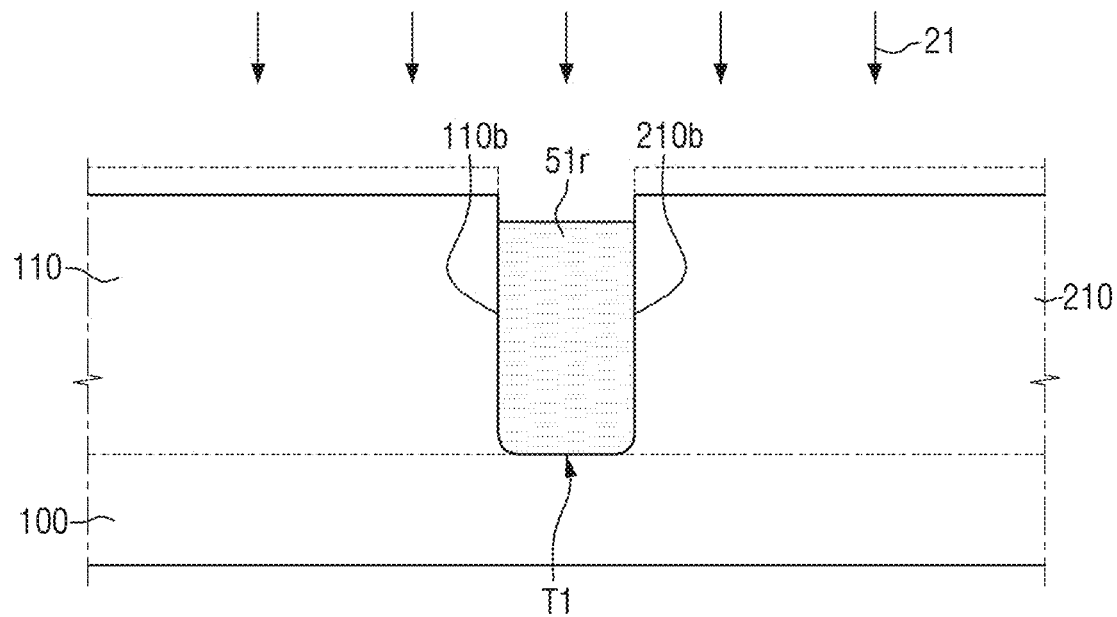
Figure 6:
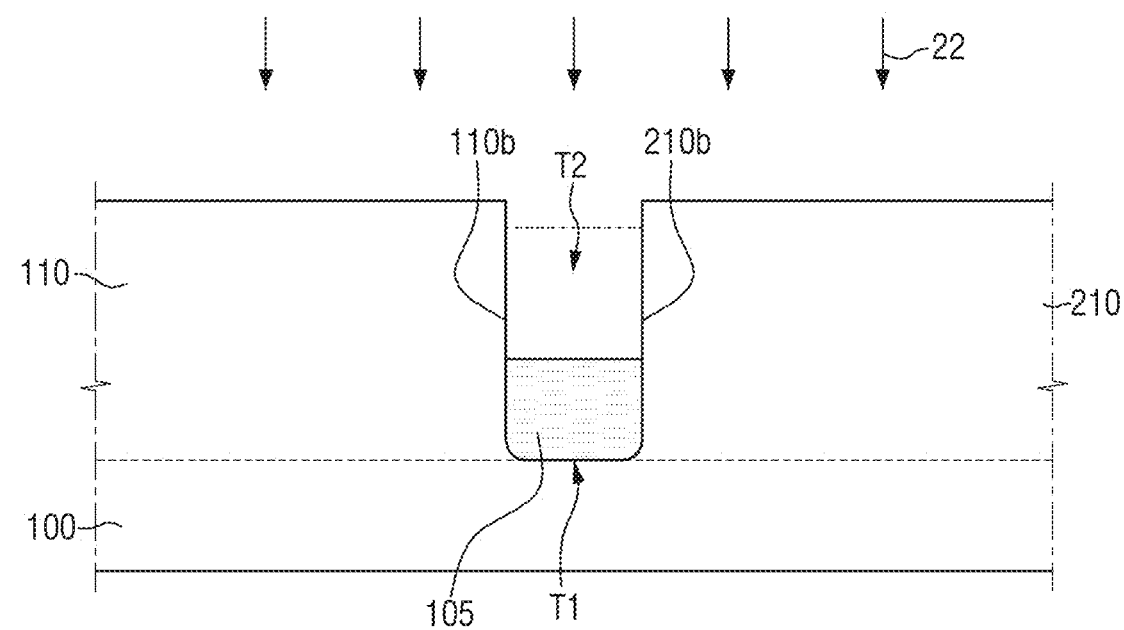

Referring to FIGS. 5 and 6, a second separation trench T2 may be formed by removing a portion of the first insulating layer 51.

By the formation of the second separation trench T2, a first field insulating layer 105 may be formed between the first fin-type pattern 110 and the second fin-type pattern 210. The first field insulating layer 105 may be a remaining portion of the first insulating layer 51 after removing of the portion of the first insulating layer 51.

The field insulating layer 105 may be formed between the short side 110b of the first fin-type pattern 110 and the short side 210b of the second fin-type pattern 210. The first field insulating layer 105 may expose a portion of the sidewall (e.g., a portion of the short side 110b) of the first fin-type pattern 110 and a portion of the sidewall (e.g., a portion of the short side 210b) of the second fin-type pattern 210.

The first filed insulating layer 105 may function as an insulating pattern separating the first fin-type pattern 110 and the second fin-type pattern 210.

In FIGS. 4 through 6, a region in which the portion of the first insulating layer 51 remains (or a region in which the field insulating layer 105 is formed) may be the first separation trench T1, and a region in which the portion of the first insulating layer 51 is removed may be the second separation trench T2.

The second separation trench T2 may have a bottom surface that is a top surface of the first field insulating layer 105. The first separation trench T1 may be connected to or communicate with the second separation trench T2.

A trench of the second separation trench T2 may be defined by the sidewall (i.e., the sidewall including the short side 110b) of the first fin-type pattern 110 and the sidewall (i.e., the sidewall including the short side 210b) of the second fin-type pattern 210.

As shown in FIGS. 5 and 6, the first insulating layer 51 may be partially removed (or may be recessed) by a dry etching process, in a state where the top surfaces of the first and second fin-type patterns 110 and 210 are exposed. For example, the dry etching process may include sequentially performing a first dry etching process 21 and a second dry etching process 22.

As shown in FIG. 5, the first and second fin-type patterns 110 and 210 may be partially etched by the first dry etching process 21 along with the first insulating layer 51.

During the first dry etching process 21, an etched (or recessed) amount of the first insulating layer 51 may be greater than an etched amount of the first and second fin-type patterns 110 and 210. Thus, a top surface of the recessed first insulating layer 51r may be lower than top surfaces of the etched first and second fin-type patterns 110 and 210.

As shown in FIG. 6, a portion of the recessed first insulating layer 51r may be etched by the second etching process 22 to form the first field insulating layer 105 between the first fin-type pattern 110 and the second fin-type pattern 210.

By the second etching process 22, a portion of each or at least one of the etched first and second fin-type patterns 110 and 210 may be etched. An etched amount of the first and second fin-type patterns 110 and 210 by the second dry etching process 22 may be less than the etched amount of the first and second fin-type patterns 110 and 210 by the first dry etching process 21.

In the first dry etching process 21, an etch selectivity of the first insulating layer 51 with respect to the first and second fin-type patterns 110 and 210 may be a first selectivity, and in the second dry etching process 22, an etch selectivity of the first insulating layer 51 with respect to the first and second fin-type patterns 110 and 210 may be a second etch selectivity. The first etch selectivity may be different from the second etch selectivity.

For example, since the etched amount of the first and second fin-type patterns 110 and 210 by the second dry etching process 22 is less than the etched amount of the first and second fin-type patterns 110 and 210 by the first dry etching process 21, the second etch selectivity may be greater than the first etch selectivity.

In some example embodiments, the second separation trench T2 may be formed by performing any one of the first dry etching process 21 and the second dry etching process 22.

Figure 7:
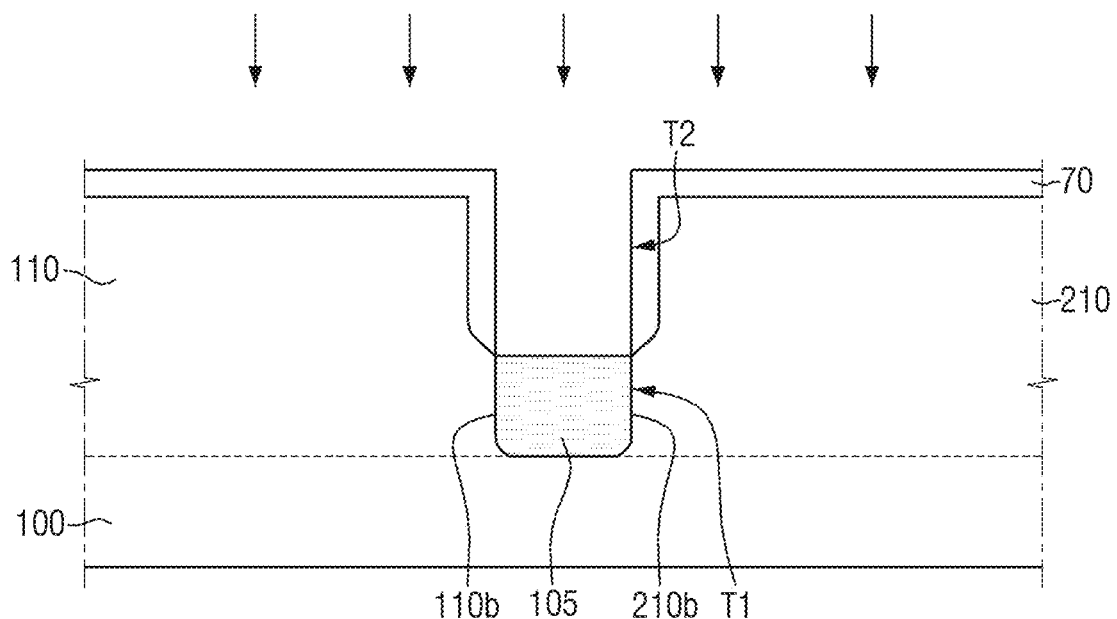

Referring to FIG. 7, a first oxide layer 70 may be formed by oxidizing a portion of the first fin-type pattern 110 and a portion of the second fin-type pattern 210 which are exposed by the second separation trench T2 (or the first field insulating layer 105).

The first oxide layer 70 may be formed on the sidewall (e.g., the short side 110b) of the first fin-type pattern 110 and on the sidewall (e.g., the short side 210b) of the second fin-type pattern 210.

The first oxide layer 70 may be formed on the top surfaces of the first and second fin-type patterns 110 and 210 which are exposed, when the sidewalls (e.g., the short sides 110b and 210b) of the first and second fin-type patterns 110 and 210 are oxidized.

Thus, the first oxide layer 70 may be on the sidewall of the second separation trench T2 and may not be formed on the bottom surface of the second separation trench T2 (or the top surface of the first field insulating layer 105).

Figure 8:
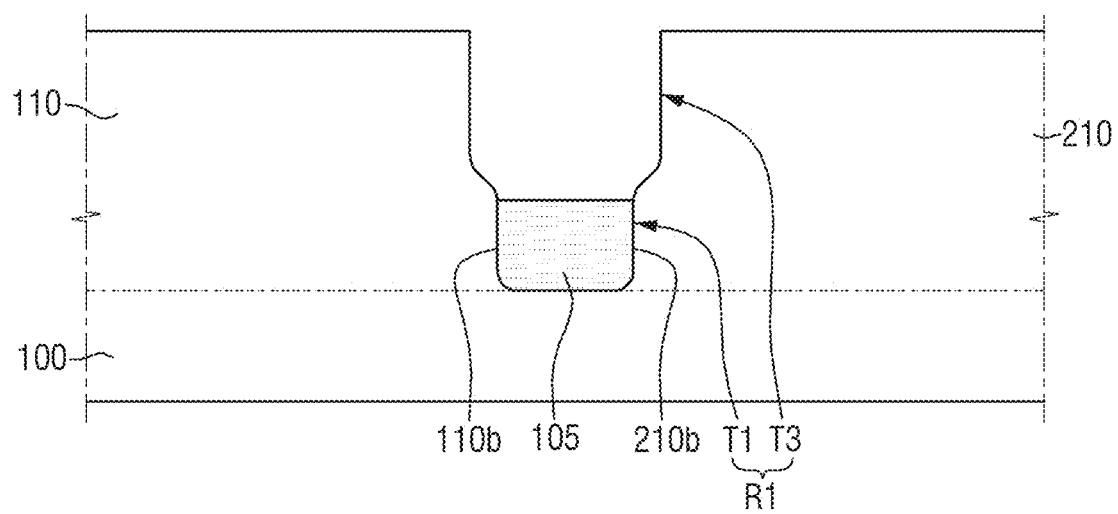

Referring to, FIG. 8, a third separation trench T3 may be formed on the first field insulating layer 105 by removing the first oxide layer 70.

Since the first oxide layer 70 formed by the oxidation of the portions of the first and second fin-type patterns 110 and 210 exposed by the second separation trench T2 is removed, a width of the third separation trench T3 may be greater than a width of the second separation trench T2.

The third separation trench T3 may be formed by enlarging the width of the second separation trench T2.

In other words, the third separation trench T3 may be formed by removing a portion of the first fin-type pattern 110 and a portion of the second fin-type pattern 210 which are exposed by the first insulating layer 105.

A first recess R1 may be formed between the first fin-type pattern 110 and the second fin-type pattern 210, by removing the first oxide layer 70.

The first recess R1 may include the first separation trench T1 and the third separation trench T3. The width of third separation trench T3 may be greater than a width of the first separation trench T1.

The third separation trench T3 may be connected to the first separation trench T1. A connection portion between the first and third separation trenches T1 and T3 may be rounded.

The first field insulating layer 105 may fill a portion of the first recess R1 since the first field insulating layer 105 fills the first separation trench T1. The first fin-type pattern 110 and the second fin-type pattern 210 of which the short sides 110b and 210b face each other may be separated by the first recess R1.

Figure 9:
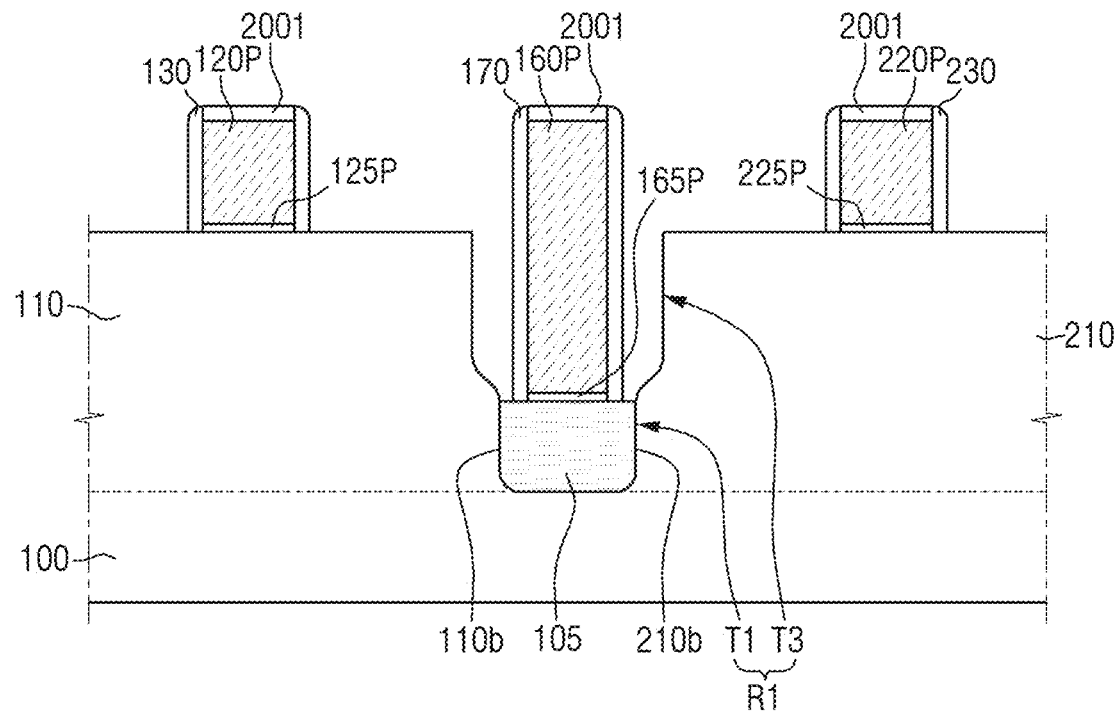

Referring to FIG. 9, an etching process using a gate hard mask pattern 2001 as an etch mask may be performed to form a first dummy gate electrode 120p, a second dummy gate electrode 220p, and a third dummy gate electrode 160p.

The first dummy gate electrode 120p may be formed on the first fin-type pattern 110 and may extend in the second direction Y1 (refer to FIG. 1). A first dummy gate insulating layer 125p may be formed between the first dummy gate electrode 120p and the first fin-type pattern 110.

The second dummy gate electrode 220p may be formed on the second fin-type pattern 210 and may extend in the second direction Y1. A second dummy gate insulating layer 225p may be formed between the second dummy gate electrode 220p and the second fin-type pattern 210.

The third dummy gate electrode 160p may be formed between the first fin-type pattern 110 and the second fin-type pattern 210 and may extend in the second direction Y1. The third dummy gate electrode 160p may be formed on the first field insulating layer 105 between the short side 110b of the first fin-type pattern 110 and the short side 210b of the second fin-type pattern 210. The third dummy gate electrode 160p may be between the first fin-type pattern 110 and the second fin-type pattern 210.

In other words, the third dummy gate electrode 160p may be formed in the first recess R1. For example, the third dummy gate electrode 160p may be formed in the third trench T3.

A third dummy gate insulating layer 165p may be formed between the third dummy gate electrode 160p and the first field insulating layer 105, but not limited thereto.

The first through third dummy gate insulating layers 125p, 225p, and 165p may include, for example, silicon oxide, silicon oxynitride, silicon nitride, and/or combinations thereof. The first through third dummy gate insulating layers 125p, 225p, and 165p may be formed by a thermal treatment, a treatment of chemicals, an atomic layer deposition (ALD) process, or a chemical deposition (CVD) process.

The first through third dummy gate electrodes 120p, 220p, and 160p may include silicon, for example, any one of poly-silicon, amorphous-silicon, and a combination thereof. The first through third dummy gate electrodes 120p, 220p, and 160p may be doped with impurities, or may not be doped with impurities.

For example, poly-silicon may be deposited by CVD process, and amorphous-silicon may be deposited by a sputtering process or a lower pressure CVD process, or a plasma enhanced CVD process, but not limited thereto.

Next, a first spacer 130 may be formed on sidewalls of the first dummy gate electrode 120p, a second spacer 230 may be formed on sidewalls of the second dummy gate electrode 220p, and a third spacer 170 may be formed on sidewalls of the third dummy gate electrode 160p.

The first through third spacers 130, 230, and 170 may include, for example, silicon nitride (SiN), silicon oxynitride (SiON), silicon oxide (SiO$_2$), silicon oxycarbonitride (SiOCN), and/or combinations thereof.

The first through third spacers 130, 230, and 170 may include a single layer or multi-layers, respectively. In the case where the first through third spacers 130, 230, and 170 each or at least one of which include multi-layers, at least one layer of each of the first through third spacers 130, 230, and 170 may include a low-k dielectric material such as silicon oxycarbonitride (SiOCN). In addition, at least one layer of each of the first through third spacers 130, 230, and 170 may have an L-shape.

Figure 10:
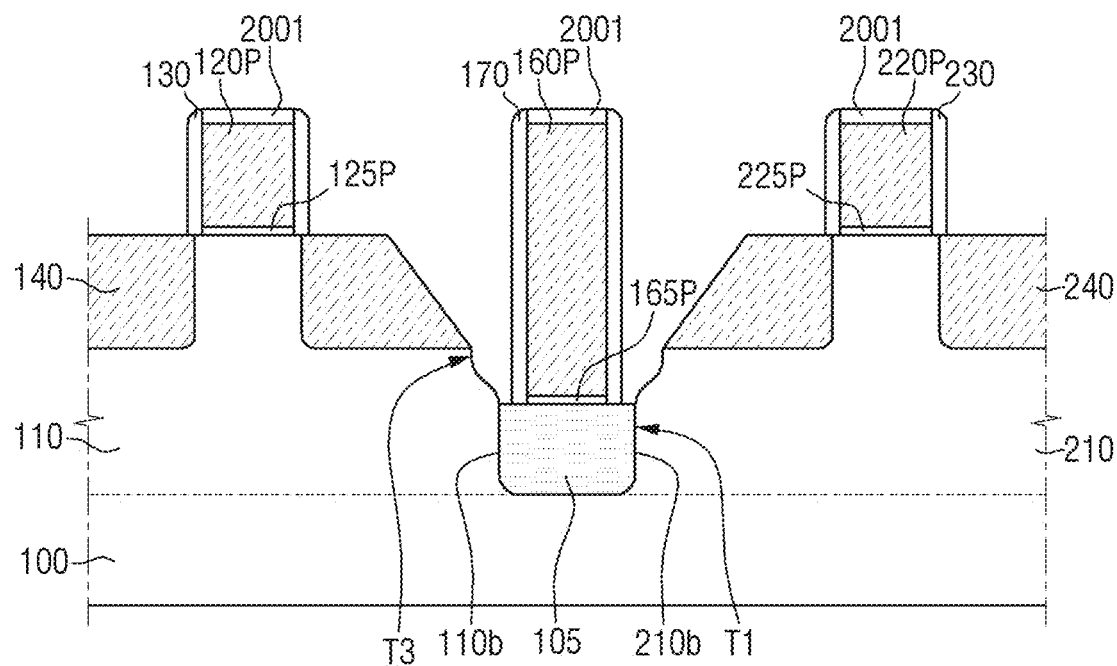

Referring to FIG. 10, first epitaxial patterns 140 may be formed on the first fin-type pattern 110 at opposite sides of the first dummy gate electrode 120p. Second epitaxial patterns 240 may be formed on the second fin-type pattern 210 at opposite sides of the second dummy gate electrode 220p.

For example, a portion of each or at least one of the first and second fin-type patterns 110 and 210 at opposite sides of each or at least one of the first and second dummy gate electrodes 120p and 220p may be removed to form recess regions, and the first epitaxial patterns 140 and the second epitaxial pattern 240 may be formed in the recess regions of the first and second fin-type patterns 110 and 210 by a selective epitaxial growth process. In some example embodiments, the formation of the recess regions may be omitted, and the first and second epitaxial patterns 140 and 240 may be formed on the first and second fin-type patterns 110 and 210, respectively, by the selective epitaxial growth process.

At least one of the first epitaxial patterns 140 may be formed at an end portion of the first fin-type pattern 110. At least one of the second epitaxial patterns 240 may be formed at an end portion of the second fin-type pattern 210.

The first epitaxial pattern 140 positioned at the end portion of the first fin-type pattern 110 and the second epitaxial pattern 240 positioned at the end portion of the second fin-type pattern may be formed to have a slanted sidewall according to characteristics of epitaxial growth at the end portions of the first and second fin-type patterns 110 and 210.

The third dummy gate electrode 120p may be disposed between the first epitaxial pattern 140 positioned at the end portion of the first fin-type pattern 110 and the second epitaxial pattern 240 positioned at the end portion of the second fin-type pattern 210.

The first epitaxial pattern 140 positioned at the end portion of the first fin-type pattern 110 and the second epitaxial pattern 240 positioned at the end portion of the second fin-type pattern 210 may not contact the third spacer 170.

The first epitaxial patterns 140 and the second epitaxial patterns 240 may be included in source/drain regions of transistors, respectively.

The first epitaxial pattern 140 may include first impurities, and the second epitaxial pattern 240 may include second impurities.

In the case where a semiconductor device including the first epitaxial pattern 140 and a semiconductor device including the second epitaxial pattern 240 are transistors having the same conductivity type, the first epitaxial pattern 140 and the second epitaxial pattern 240 may include impurities of which a conductivity type is the same.

In the case where the semiconductor device including the first epitaxial pattern 140 and the semiconductor device including the second epitaxial pattern 240 are transistors having different conductivity types, the first epitaxial pattern 140 and the second epitaxial pattern 240 may include impurities of which a conductivity type is different.

In the case where the semiconductor device including the first epitaxial pattern 140 is a PMOS transistor, the first epitaxial pattern 140 may include, for example, a compressive stress material. The compressive stress material may be a material of which a lattice constant is greater than the lattice constant of silicon. The first epitaxial pattern 140 may include, for example, silicon germanium (SiGe).

The compressive stress material may apply a compressive stress to the first fin-type pattern 110 (or a channel region of the PMOS transistor) such that mobility of carriers in the channel region may be improved.

In the case where the semiconductor device including the first epitaxial pattern 140 is an NMOS transistor, the first epitaxial pattern 140 may include, for example, a tensile stress material. When the first fin-type pattern 110 is formed of or include silicon, the first epitaxial pattern 140 may include a material (e.g., SiC) of which a lattice constant is less than the lattice constant of silicon. The tensile stress material may apply a tensile stress to a first fin-type pattern 110 (or a channel region of the NMOS transistor) such that mobility of carriers in the channel region may be improved.

In some example embodiments, in the case where the semiconductor device including the first epitaxial pattern 140 is an NMOS transistor, the first epitaxial pattern 140 may include the same material (e.g., silicon) as the first fin-type pattern 110.

Since a description of the second epitaxial pattern 240 is similar to or the same as the above description of the first epitaxial pattern 140, a detailed description thereof may be omitted herein.

Bottom surfaces of the first and second epitaxial patterns 140 and 240 may be positioned at a higher level than the top surface of the first field insulating layer 105, but not limited thereto.

When the bottom surfaces of the first and second epitaxial patterns 140 and 240 is higher than the top surface of the first field insulating layer 105, portions of the first and the second fin-type patterns 110 and 210 under the first and second epitaxial patterns 140 and 240 may be exposed by the third trench T3, but not limited thereto.

When the recess regions for forming the first and second epitaxial patterns 140 and 240 is formed, portions of the first and second fin-type patterns 110 and 210 may be exposed or may not be exposed by the third trench T3 depending on a depth of the recess regions.

Figure 11:
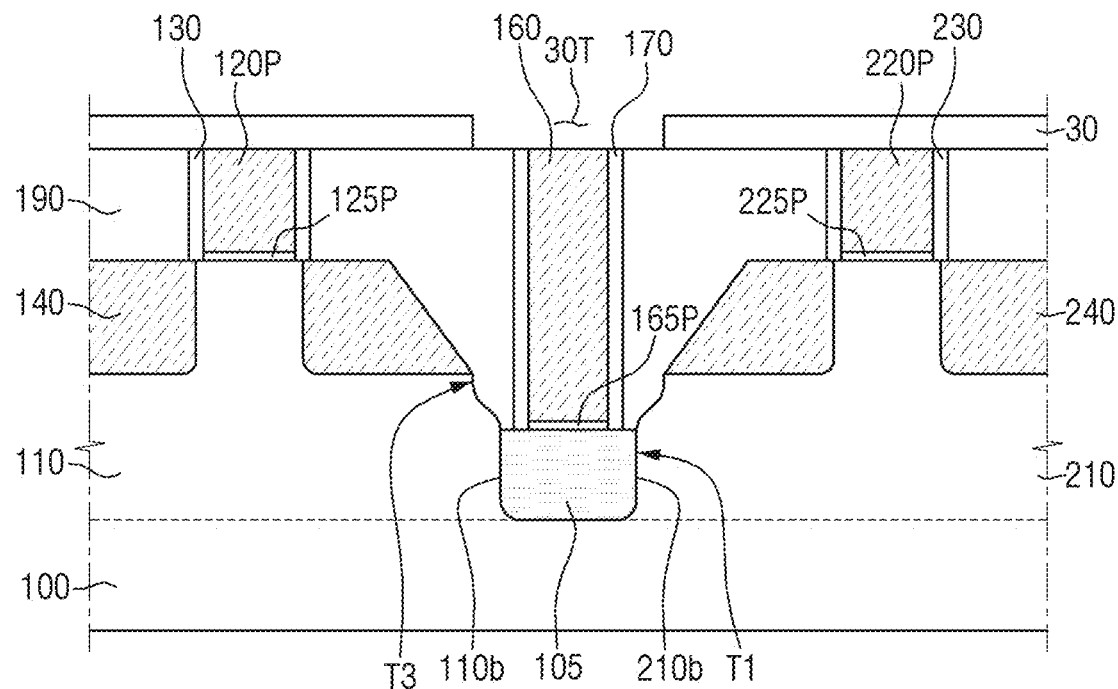

Referring to FIG. 11, an interlayer insulating layer 190 may be formed on the substrate 100 to cover the first and second fin-type patterns 110 and 210 and the first through third dummy gate electrodes 120p, 220p, and 160p.

The interlayer insulating layer 190 may cover the first and second epitaxial patterns 140 and 240 and may fill the third trench T3.

The interlayer insulating layer 190 may be planarized until top surfaces of the first through third dummy gate electrodes 120p, 220p, and 160p are exposed. Thus, the gate hard mask pattern 2001 may be removed.

The interlayer insulating layer 190 may include, for example, at least one of silicon oxide, silicon nitride, silicon oxynitride, and a low-k dielectric material.

The low-k dielectric material may include, for example, flowable oxide (FOX), torene silazene (TOSZ), undoped silica glass (USG), borosilica glass (BSG), phosphosilica glass (PSG), borophosphosilica glass (BPSG), plasma enhanced tetra ethyl ortho silicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SILK, polyimide, porous polymeric material, or combinations thereof, but not limited thereto.

A first mask pattern 30 may be formed on the substrate 100. The first mask pattern 30 may cover the top surfaces of the first and second dummy gate electrodes 120p and 220p and may expose the top surface of the third dummy gate electrode 160p.

The first mask pattern 30 may include a first opening 30T exposing the top surface of the third dummy gate electrode 160p.

A top end of the third spacer 170 may be exposed by the first opening 30T along with the top surface of the third dummy gate electrode 160p, but not limited thereto.

Figure 12:
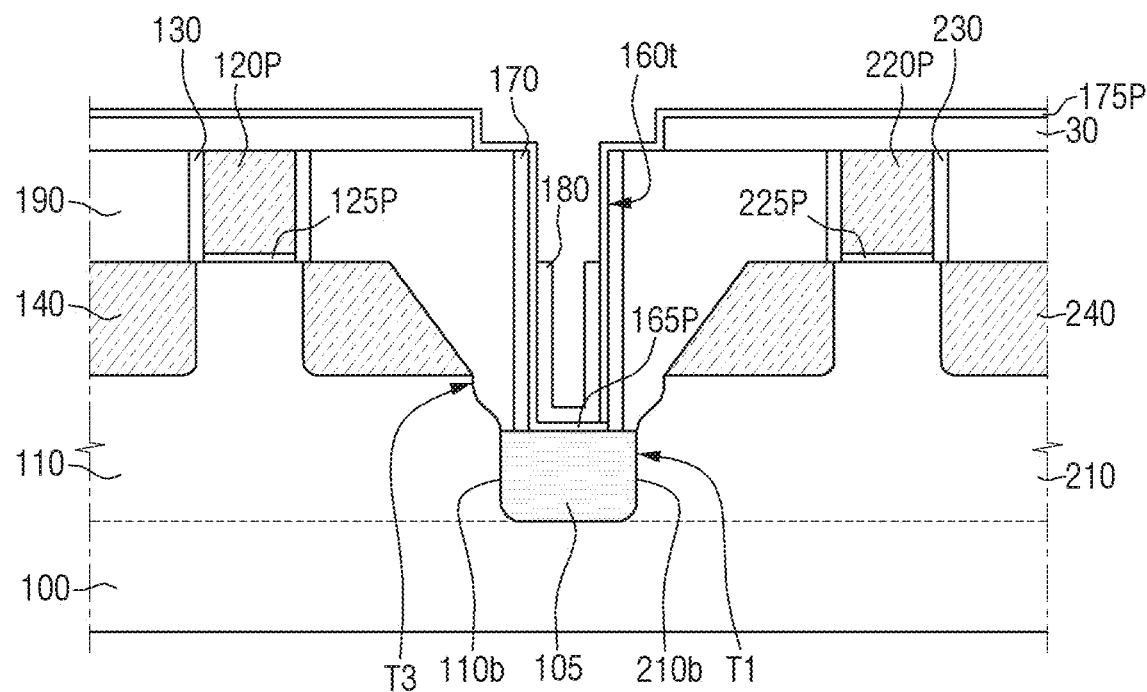

Referring to FIG. 12, the third dummy gate electrode 160b may be removed using the first mask pattern 30 as an etch mask. Further, the third dummy gate insulating layer 165p may be removed.

A first gate trench 160t may be formed by removing the third gate electrode 160p. The top surface of the field insulating layer 105 may be exposed by the first gate trench 160t.

In some example embodiments, when the third gate electrode 160p and the third gate insulating layer 165p are removed, a portion of the interlayer insulating layer 190 and a portion of the third spacer 170 which are not covered by the first mask pattern 30 may be removed.

A liner layer 175p may be formed to extend along a sidewall and a bottom surface of the first gate trench 160t and a top surface of the first mask pattern 30.

The liner layer 175p may include a material having an etch selectivity with respect to a material included in the third spacer 170. The liner layer 175p may include, for example, at least one of silicon oxide, silicon nitride, silicon oxynitride, silicon carbonitride, silicon oxycarbonitride, and poly-silicon.

The liner layer 175p may be formed of or include a single layer, but not limited thereto. For example, the liner layer 175p may be formed of or include multi-layers.

An insulating protrusion pattern 180 may be formed to extend along a portion of the sidewall and the bottom surface of the first gate trench 160t. The insulating protrusion pattern 180 may be formed in the first gate trench 160t and may have a top end lower than the top end of the third gate spacer 170.

The insulating protrusion pattern 180 may be formed between the first epitaxial pattern 140 and the second epitaxial pattern 240. The top end of the insulating protrusion pattern 180 may be substantially coplanar with or higher than the top surfaces of the first and second fin-type patterns 140 and 240.

More specifically, an insulating liner layer may be formed on the liner layer 175p and may extend along a profile of the liner layer 175p. The insulating liner layer may have a material having an etch selectivity with respect to a material included in the liner layer 175p.

The insulating liner layer may include, for example, at least one of silicon oxide, silicon nitride, silicon oxynitride, silicon carbonitride, and silicon oxycarbonitride.

A portion of the insulating liner layer which is formed on the sidewall of the first gate trench 160t may be removed to form the protruding insulating pattern 180. When the insulating liner layer is removed, a portion of the insulating liner layer on the first mask pattern 30 may also be removed. The liner layer 175b in a region in which the insulating liner layer is removed may remain due to the etch selectivity between the insulating liner layer and the liner layer 175p.

In some example embodiments, when the insulating protrusion pattern 180 is formed, a portion of the insulating liner layer formed on the bottom surface of the first gate trench 160t may also be removed.

In some example embodiments, the insulating protrusion pattern 180 may fill a portion of the first gate trench 160t. Thus, a space in the insulating protrusion pattern 180 may not be formed.

A semiconductor pattern (e.g., a portion of each or at least one of the first and second fin-type patterns 110 and 210) may not be interposed between the insulating protrusion pattern 180 and the first epitaxial pattern 140 positioned at the end portion of the first fin-type pattern 110 and/or between the insulating protrusion pattern 180 and the second epitaxial pattern 240 positioned at the end portion of the second fin-type pattern 210.

Figure 13:
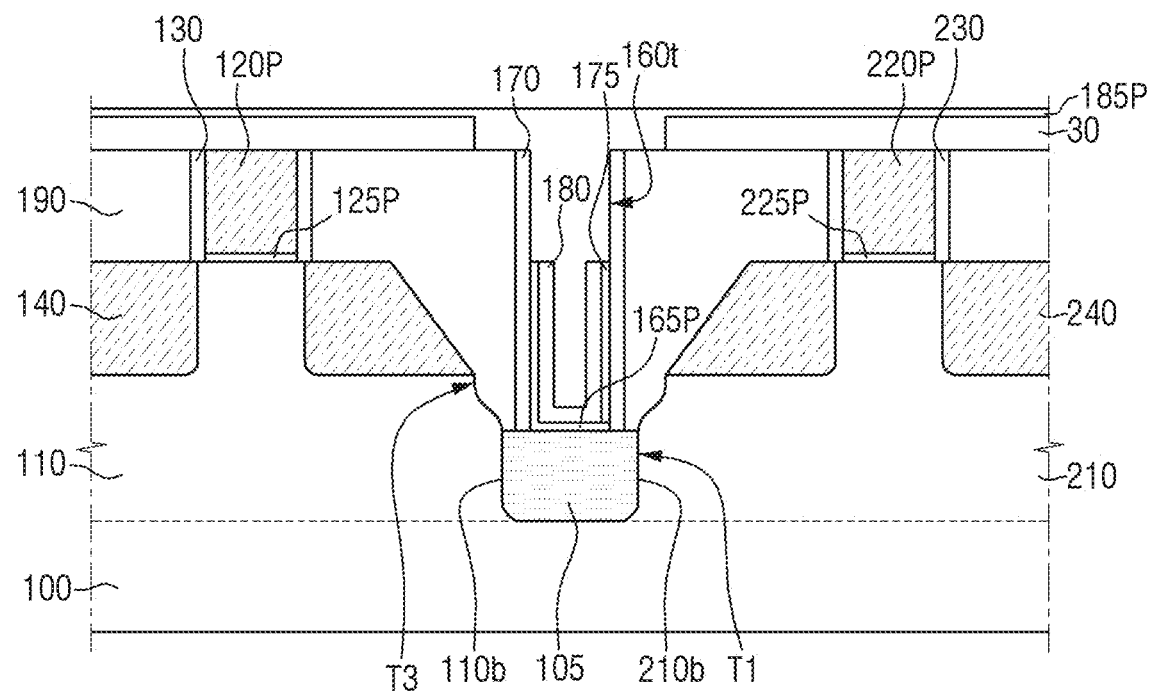

Referring to FIG. 13, a sacrificial layer 185p may be formed on the insulating protrusion pattern 180.

The sacrificial pattern 185p may fill the first gate trench 160t and may cover the top surface of the first mask pattern 30.

The sacrificial pattern 185p may include, for example, silicon, silicon germanium, germanium, silicon oxide, silicon nitride, silicon oxynitride, flowable oxide (FOX), tonen silazen (TOSZ), undoped silica glass (USG), borosilica glass (BSG), phosphsosilica glass (PSG), borophosphosilica glass (BPSG), plasma enhanced tetra ethyle ortho silicate (TEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SiLK, polyimide, porous polymeric material, spin on glass (SOG), spin on hardmask (SOH), and/or combinations thereof, but not limited thereto.

Before the sacrificial layer 185p is formed, a portion of the liner layer 175p exposed by the insulating protrusion pattern 180 may be removed to form the liner 175.

In some example embodiments, the liner layer 175p may remain on the first mask pattern 30.

Figure 14:
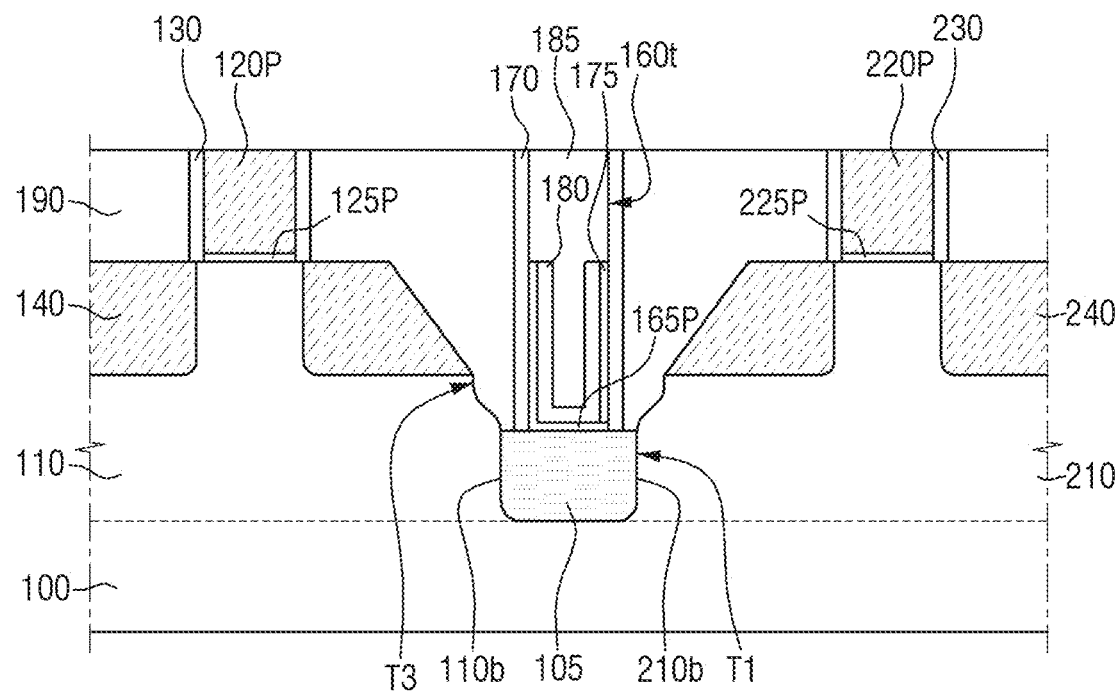

Referring to FIG. 14, a portion of the sacrificial layer 185p may be removed to form a sacrificial pattern 185 filling the first gate trench 160t.

The sacrificial pattern 185 may be formed by removing a portion of the sacrificial pattern on the first mask pattern 30.

When the sacrificial pattern 185 is formed, the first mask pattern 30 may be removed. Accordingly, the first and second gate electrodes 120p and 220p may be exposed.

Referring to FIG. 15A, the sacrificial pattern 185, and the first and second dummy gate electrodes 120p and 220p may be removed.

Further, the first and second dummy gate insulating layers 125p and 225p may be removed.

By removing the first second dummy gate electrode 120p and the first dummy gate insulating layer 125p, a portion of the first fin-type pattern 110 may be exposed and a second gate trench 120t defined by the first spacer 130 may be formed.

By removing the second dummy gate electrode 220p and the second dummy gate insulating layer 225p, a portion of the second fin-type pattern 210 may be exposed and a third gate trench 220t defined by the second spacer 230 may be formed.

A first gate insulating layer 125 may be formed to extend along a sidewall and a bottom surface of the second gate trench 120t, a second gate insulating layer 225 may be formed to extend along a sidewall and a bottom surface of the third gate trench 220t, and a conductive pattern liner 165 may be formed in the first gate trench 160t having the insulating protrusion pattern 180 to extend along the sidewall of the first gate trench 160t and a profile of the insulating protrusion pattern 180.

A first gate electrode 120 may be formed on the first gate insulating layer 125 to fill the second gate trench 120t, a second gate electrode 220 may be formed on the second gate insulating layer 225 to fill the third gate trench 220t, and a conductive pattern 160 may be formed on the conductive pattern liner 165 to fill the first gate trench 160t. The conductive pattern 160 may cover (or protrude above) the insulating protrusion pattern 180.

The first and second gate insulating layers 125 and 225 and the conductive pattern liner 165 may include, for example, silicon oxide, silicon nitride, silicon oxynitride, and/or a high-k dielectric material of which a dielectric constant is higher than the dielectric constant of silicon oxide. The high-k dielectric material may include insulating metal oxide, for example, at least one of hafnium oxide, hafnium silicate, hafnium aluminum oxide, lanthanum oxide, lanthanum aluminum oxide, zirconium oxide, zirconium silicate, tantalum oxide, titanium oxide, barium strontium titanium oxide, barium titanium oxide, strontium titanium oxide, yttrium oxide, aluminum oxide, lead scandium tantalum oxide, and lead zinc niobate.

In some example embodiments, the high-k dielectric material may include, nitride and/or oxynitride of metal contained in the insulating metal oxide as described above. For example, nitride and/or oxynitride of metal may be hafnium nitride and/or hafnium oxynitride, but not limited thereto.

The first and second gate electrodes 120 and 160 and the conductive pattern 160 may include, for example, titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Jr), osmium (Os), silver (Ag), gold (Au), zinc (Zn), vanadium (V) and/or combinations thereof.

The first and second gate electrodes 120 and 220 and the conductive pattern 160 may include, for example, conductive metal oxide, conductive metal oxynitride, conductive metal oxycarbide, and/or conductive oxycarbonitride.

In some example embodiments, an air gap may be formed in the conductive pattern 160 and/or between the conductive pattern 160 and the conductive pattern liner 165.

In a cross-sectional view taken along the length direction of the first and second fin-type patterns 110 and 210 as shown in FIG. 15, each or at least one of the first and second epitaxial patterns 140 and 240 may include a first slanted surface which is inclined by a first angle relative to a plane parallel to the top surface of each or at least one of the first and second fin-type patterns 110 and 210. At least one of the first and second epitaxial patterns 140 and 240 may include the top surface parallel to the top surface of a corresponding one of the first and second fin-type patterns 110 and 210.

The cross-sectional view taken along the length direction of the first and second fin-type patterns 110 and 210 may be the same as the cross-sectional view taken along the line A-A of FIG. 1.

In some example embodiments, the first and second epitaxial patterns 140 and 240 may have various types of cross-sections.

Referring to FIG. 15B, each or at least one of the first and second epitaxial patterns 140 and 240 may include a second slanted surface and a third slanted surface which is respectively inclined by a second angle and by a third angle relative to a plane parallel to the top surface of each or at least one of the first and second fin-type patterns 110 and 210. At least one of the first and second epitaxial patterns 140 and 240 may not include a top surface parallel to the top surface of a corresponding one of the first and second fin-type patterns 110 and 210.

Referring to FIG. 15C, each or at least one of the first and second epitaxial patterns 140 and 240 may include a fourth slanted surface and a fifth slanted surface which are respectively inclined by a fourth angle and by a fifth angle relative to a plane parallel to the top surface of each or at least one of the first and second fin-type patterns 110 and 210. At least one of the first and second epitaxial patterns 140 and 240 may include the top surface parallel to the top surface of a corresponding one of the first and second fin-type patterns 110 and 210.

FIGS. 16 through 20 are cross-sectional views illustrating stages of a method of manufacturing a semiconductor device according to some example embodiments of the inventive concepts.

Figure 16:
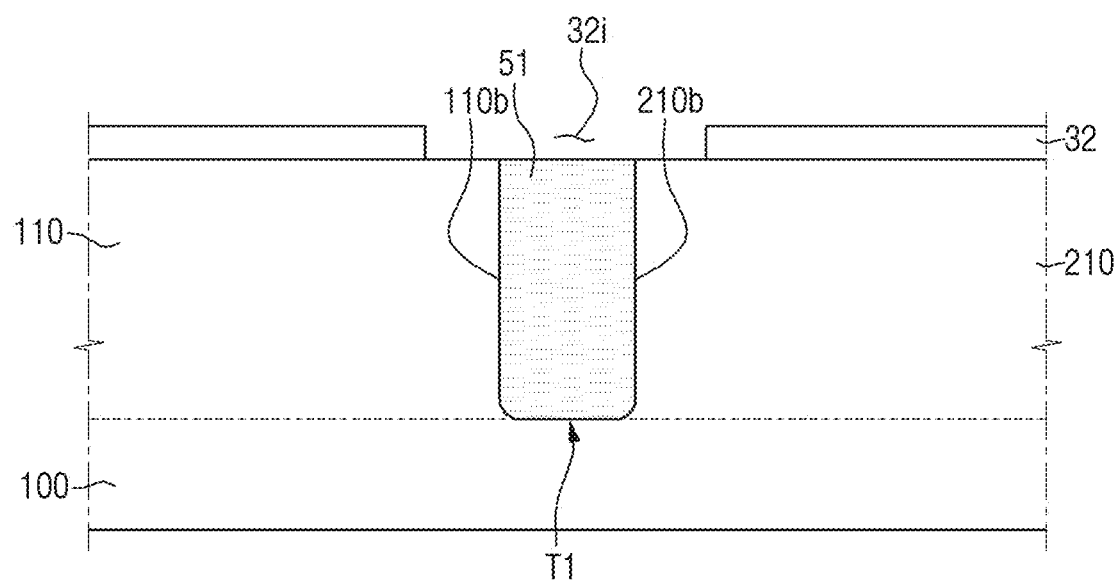
FIGS. 16 through 20 illustrate stages of a method of fabricating a semiconductor device according to some example embodiments of the inventive concepts.

FIG. 16 illustrates a proceeding process after the process described with reference to FIG. 4.

Referring to FIG. 16, a second mask pattern 32 may be formed on the first and second fin-type patterns 110 and 210 and the first insulating layer 51. The second mask pattern 32 may include a second opening 32i.

The second opening 32i may overlap with the first insulating layer 51, a portion of first fin-type pattern 110 and a portion of the second fin-type pattern 210. In other words, the second opening 32i may expose the first insulating layer 51, a portion of first fin-type pattern 110 and a portion of the second fin-type pattern 210.

Figure 17:
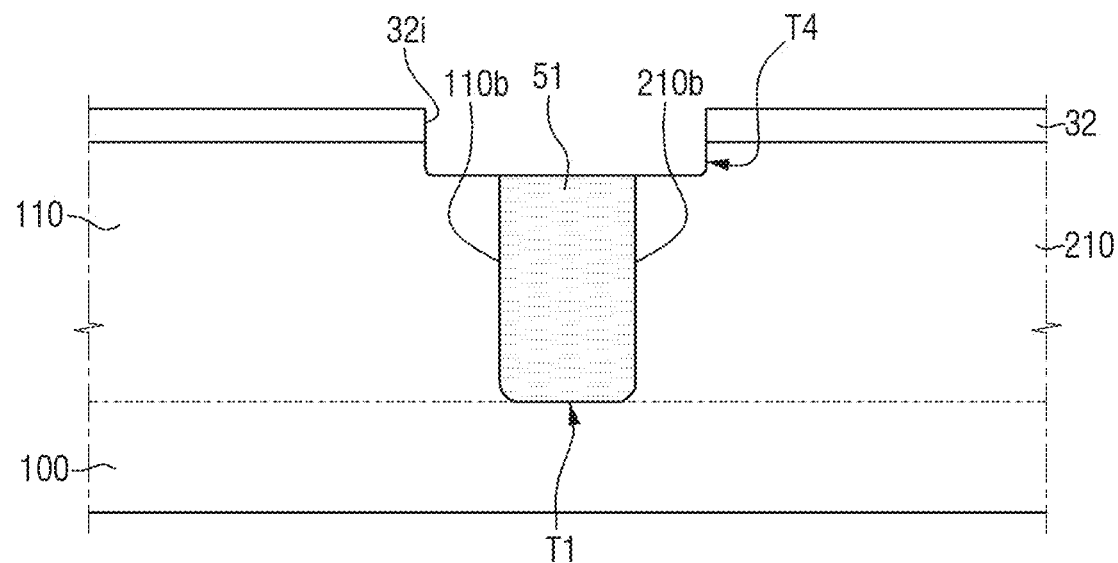
Figure 18:
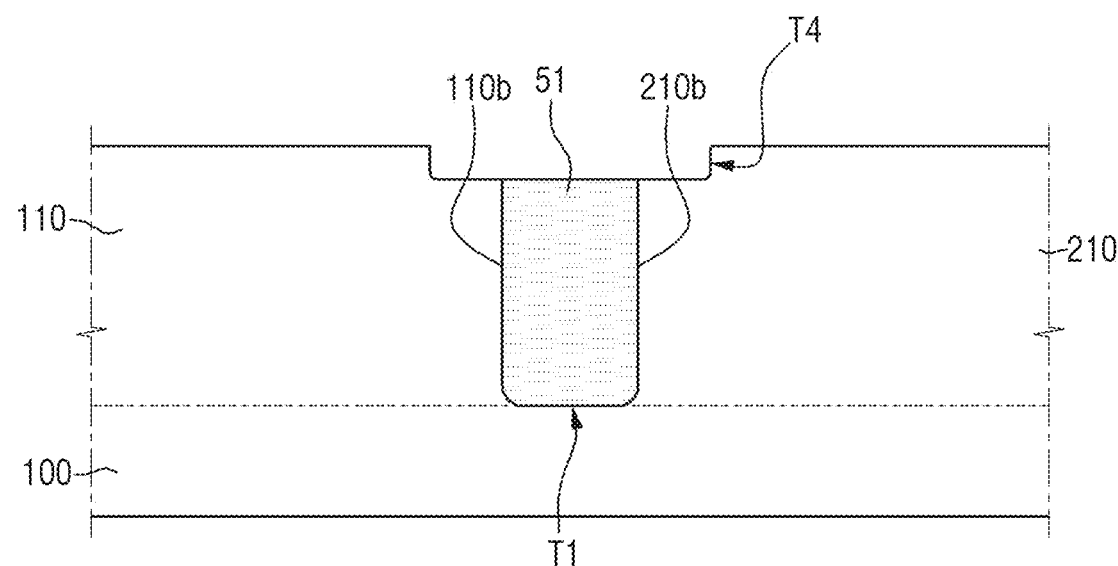

Referring to FIGS. 17 and 18, a fourth separation trench T4 may be formed by removing a portion of the first insulating layer 51, a portion of the first fin-type pattern 110 and a portion of the second fin-type pattern 210 using the second mask pattern 32 as an etch mask.

The fourth separation trench T4 may be formed by recessing a portion of the top surface of the first fin-type pattern 110, a portion of the top surface of the second fin-type pattern 210, and the top surface of the first insulating layer 51.

The fourth separation trench T4 may be connected to or communicated with the first separation trench T1. While the fourth separation trench T4 is formed, the first separation trench T1 may be filled with the remaining first insulating layer 51.

A width of the fourth separation trench T4 may be greater than the width of the first separation trench T1.

The second mask pattern 32 may be removed to expose the top surfaces of the first and second fin-type patterns 110 and 210.

The top surfaces of the first and second fin-type patterns 110 and 210 may have a stepwise shape by the formation of the fourth separation trench T4.

Figure 19:
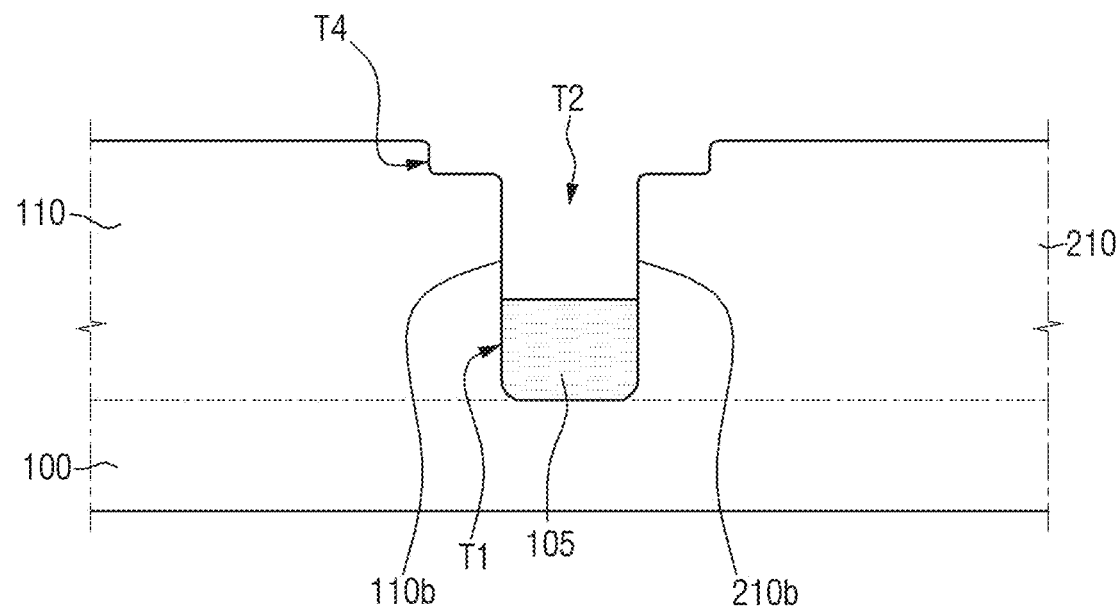

Referring to FIG. 19, a second separation trench T2 may be formed by removing the first insulating layer 51 in a state where the top surfaces of the first and second fin-type patterns 110 and 210 are exposed.

When the second separation trench T2 is formed, a first field insulating layer 105 may be formed between the first fin-type pattern 110 and the second fin-type pattern 210. The first field insulating layer 105 may be formed between a short side 110b of the first fin-type pattern 110 and a short side 210b of the second fin-type pattern 210.

The second field insulating layer 105 may expose a portion of a sidewall (e.g., the short side 110a) of the first fin-type pattern 110 and a portion of a sidewall (e.g., the short side 210a) of the second fin-type pattern 210.

In the first fin-type pattern 110, the sidewall including the short side 110b may be exposed by the second and fourth separation trenches T2 and T4.

In the second fin-type pattern 210, the sidewall including the short side 210b may be exposed by the second and fourth separation trenches T2 and T4.

The second separation trench T2 may be defined as a space between the first separation trench T1 and the fourth separation trench T4. The second separation trench T2 may be connected to the first and fourth separation trenches T1 and T4.

The second separation trench T2 may be formed by the dry etch process as described with reference to FIGS. 5 and 6.

Figure 20:
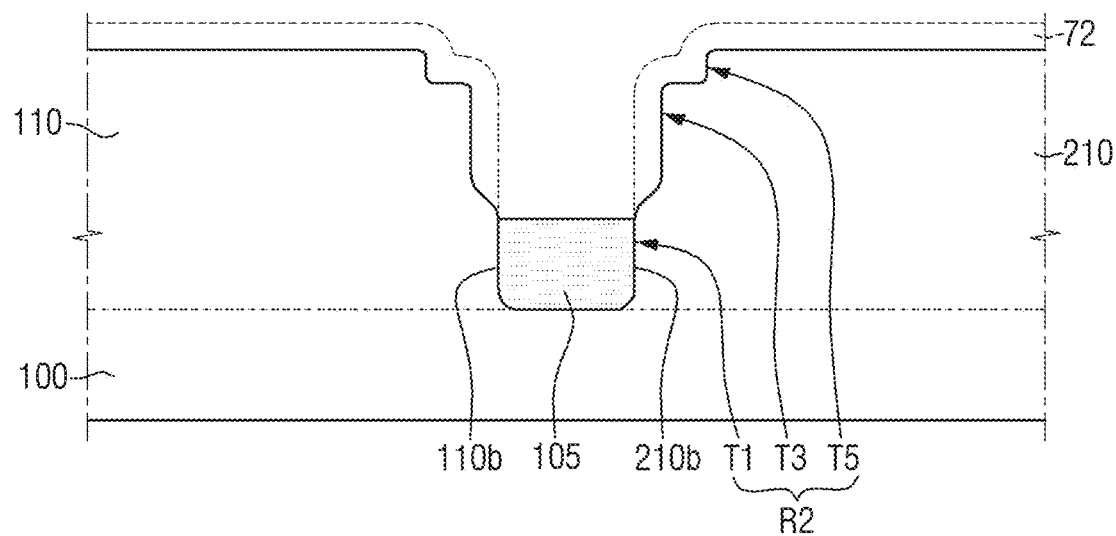

Referring to FIG. 20, a third separation trench T3 may be formed by enlarging a width of the second separation trench T2 and a fifth separation trench T5 may be formed by enlarging a width of the fourth separation trench T4.

For example, a second oxide layer 72 may be formed by oxidizing a portion of each or at least one of the first and second fin-type patterns 110 and 210 exposed by the second and fourth separation trenches T2 and T4. A portion of each or at least one of the sidewalls (e.g., a portion of each or at least one of the short sides 110b and 210b) and the top surface of each or at least one of the first and second fin-type patterns 110 and 210, which are exposed by the first field insulating layer 105, may be oxidized.

Thus, the second oxide layer 72 may be formed on the sidewalls (e.g., the short sides 110b and 210b) of the first and second fin-type patterns 110 and 210 exposed by the first field insulating layer 105 and formed on the top surfaces of the first and second fin-type patterns 110 and 210. The second oxide layer 72 may be formed on a sidewall of the second separation trench T2 and on a sidewall of the fourth separation trench T4.

The second oxide layer 72 may be removed to form the third separation trench T3 and the fifth separation trench T5.

Since the second oxide layer 72 formed by the oxidation of the portions of the first and second fin type patterns 110 and 210 exposed by the first field insulating layer 105 is removed, the first and second fin-type patterns 110 and 210 may be partially removed. As a result, the third separation trenches T3 may have a greater width than the width of the second separation trench T2 and the fifth separation trench T5 may have a greater width than the width of the fourth separation trench T4.

According to the removal of the second oxide 72, a second recess R2 may be formed between the first fin-type pattern 110 and the second fin-type pattern 210. The first and second fin-type patterns 110 and 210, of which the short sides 110b and 210b face each other, may be separated by the second recess R2.

The second recess R2 may include the first separation trench T1, the third separation trench T3, and the fifth separation trench T5. The width of the third separation trench T3 may be greater than the width of the first separation trench T1 and may be less than the width of the fifth separation trench T5.

The first separation trench T1 may be connected to the third separation trench T3. A connection portion between the first separation trench T1 and the third separation trench T3 may be rounded.

Since the field insulating layer 105 fills the first separation trench T1, the field insulating layer 105 may fill a portion of the second recess R2.

FIGS. 21 through 28 are cross-sectional views illustrating stages of a method of manufacturing a semiconductor device according to some example embodiments of the inventive concepts.

Figure 21:
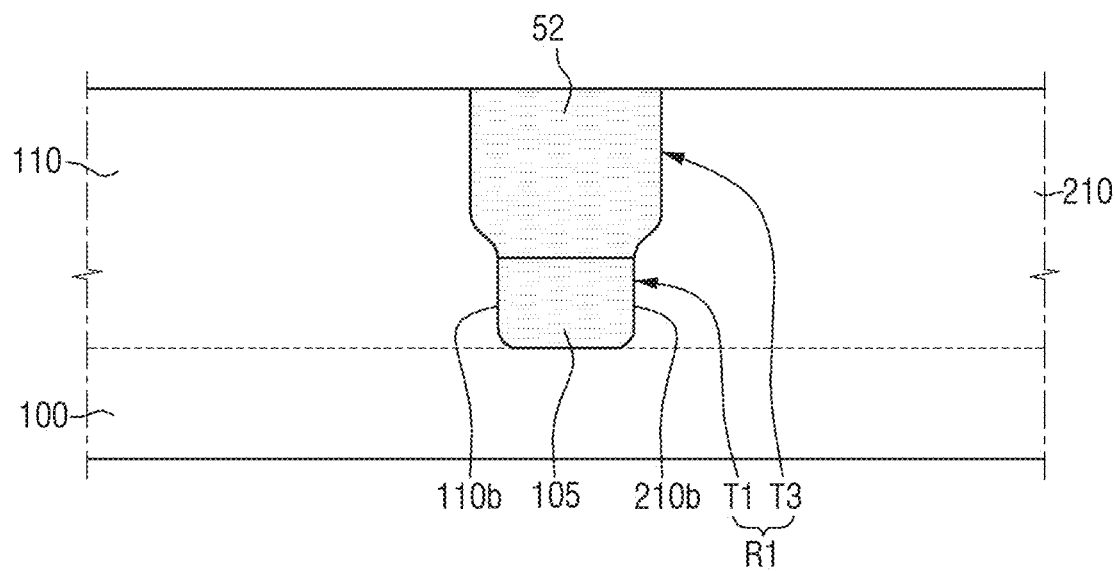
FIGS. 21 through 28 illustrate stages of a method of fabricating a semiconductor device according to some example embodiments of the inventive concepts.

FIG. 21 illustrates a proceeding process after the process described with reference to FIG. 8.

Referring to FIG. 21, a second insulating layer 52 may be formed on the first field insulating layer 105.

The second insulating layer 52 may be formed in the third separation trench T3. The second insulating layer 52 may fill the third trench T3.

The first recess R1 including the first separation trench T1 and the third separation trench T3 may be filled with an insulating material. For example, the first field insulating layer 105 may fill the first separation trench T1 and the second insulating layer 52 may fill the third separation trench T3.

A top surface of the second insulating layer 52 may be substantially coplanar with the top surfaces of the first and second fin-type patterns 110 and 210, but not limited thereto.

The second insulating layer 52 may include, for example, an oxide layer, a nitride layer, an oxynitride layer, and/or a combination thereof. The first field insulating layer 51 may include, for example, at least one of silicon oxide, silicon nitride, silicon oxynitride, and a low-k dielectric material of which a dielectric constant is lower than the dielectric constant of silicon oxide. The low-k dielectric material may include, for example, flowable oxide (FOX), tonen silazen (TOSZ), undoped silica glass (USG), borosilica glass (BSG), phosphsosilica glass (PSG), borophosphosilica glass (BPSG), plasma enhanced tetra ethyle ortho silicate (TEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SILK, polyimide, porous polymeric material, and/or combinations thereof, but not limited thereto.

Figure 22:
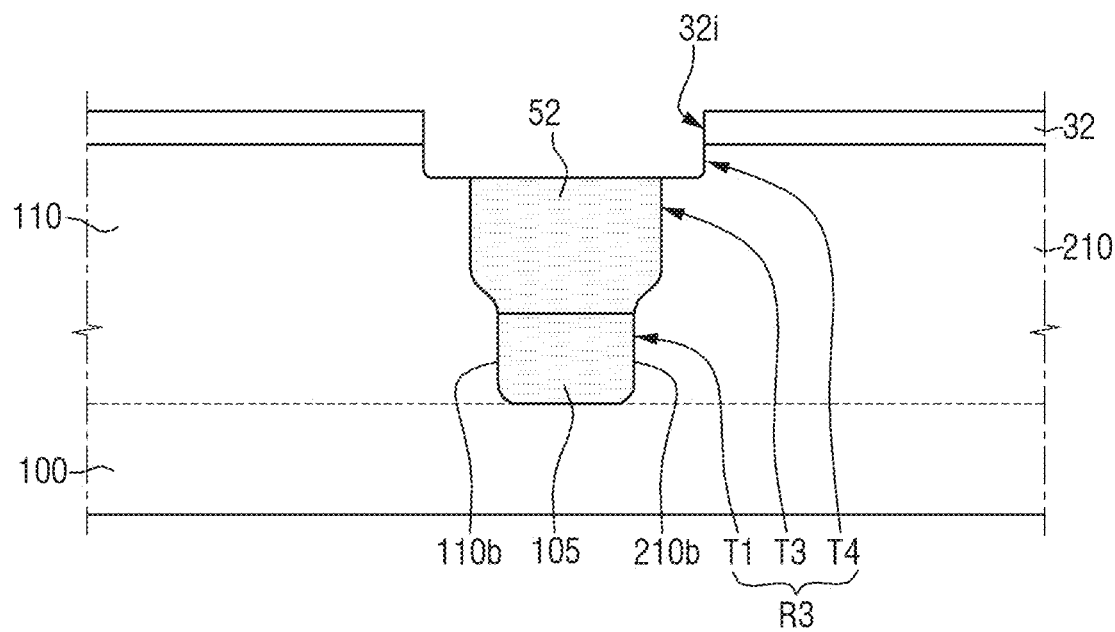

Referring to FIG. 22, a second mask pattern 32 having a second opening 32i therein may be formed on the first and second fin-type patterns 110 and 210 and the second insulating layer 52.

The second opening 32i may overlap with a portion of the first fin-type pattern 110, a portion of the second fin-type pattern 210, and the second insulating layer 52. The second opening 32i may expose a portion of the first fin-type pattern 110, a portion of the second fin-type pattern 210, and the second insulating layer 52.

A fourth separation trench T4 may be formed by etching a portion of the first fin-type pattern 110, a portion of the second fin-type pattern 210, and the second insulating layer 52 using the second mask pattern 32 as an etch mask. In other words, the fourth separation trench T4 may be formed by recessing a portion of a top surface of the first fin-type pattern 110, a portion of a top surface of the second fin-type pattern 210, and a top surface of the second insulating layer 52.

The third separation trench T3 may be connected to the fourth separation trench T4. The third separation trench T3 may be filled with the remaining second insulating layer 52 while forming the fourth separation trench T4.

A width of the fourth separation trench T4 may be greater than the width of the third trench T3.

A third recess R3 may be formed between the first fin-type pattern 110 and the second fin-type pattern 210. The first and second fin-type patterns 110 and 210, of which short sides 110b and 210b face each other, may be separated by the third recess R3.

The third recess R3 may include the first separation trench T1, the third separation trench T3, and the fourth separation trench T4. The width of the third separation trench T3 is greater than the width of the first separation trench T1.

The first separation trench T1 may be connected to the third separation trench T3. A connection portion between the first separation trench T1 and the third separation trench T3 may be rounded.

The first field insulating layer 105 and the second insulating 52 may be formed in the third recess R3. In other words, a portion of the third recess R3 may be filled with an insulating material.

Figure 23:
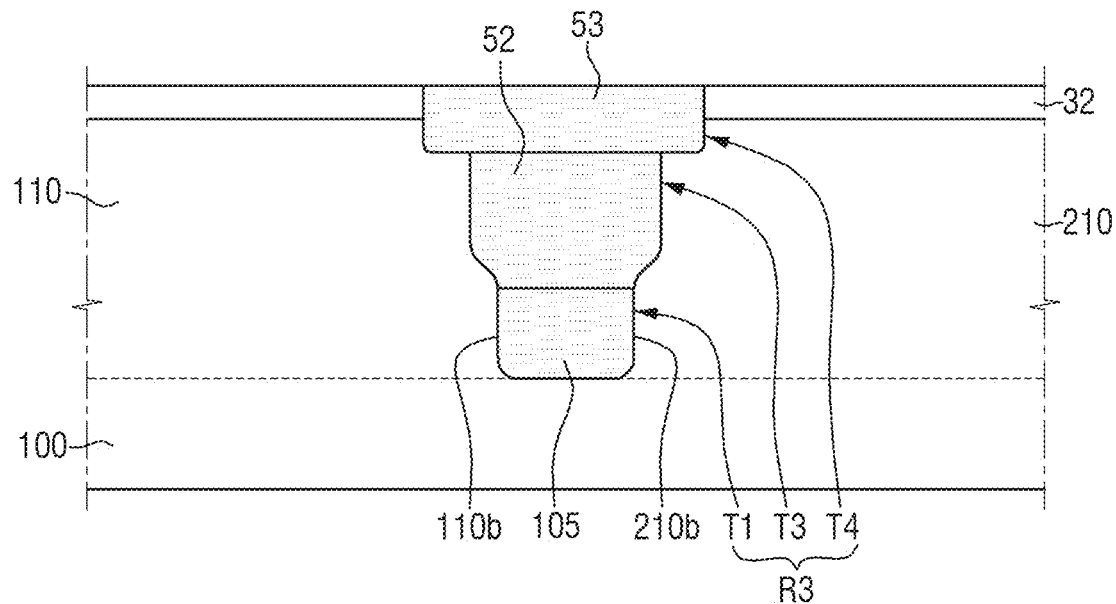

Referring to FIG. 23, a third insulating layer 53 may be formed to fill the fourth separation trench T4 and the second opening 32i.

More specifically, an insulating material may be formed on the second mask pattern 32 enough to fill the second opening 32i and the fourth separation trench T4, and then may be removed by a planarization process to form the third insulating layer 53.

The third insulating layer 53 may include, for example, oxide layer, nitride layer, oxynitride layer, and/or a combination thereof. The first field insulating layer 51 may include, for example, at least one of silicon oxide, silicon nitride, silicon oxynitride, and a low-k dielectric material of which a dielectric constant is lower than the dielectric constant of silicon oxide. The low-k dielectric material may include, for example, flowable oxide (FOX), tonen silazen (TOSZ), undoped silica glass (USG), borosilica glass (BSG), phosphsosilica glass (PSG), borophosphosilica glass (BPSG), plasma enhanced tetra ethyle ortho silicate (TEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SILK, polyimide, porous polymeric material, and/or combinations thereof, but not limited thereto.

Figure 24:
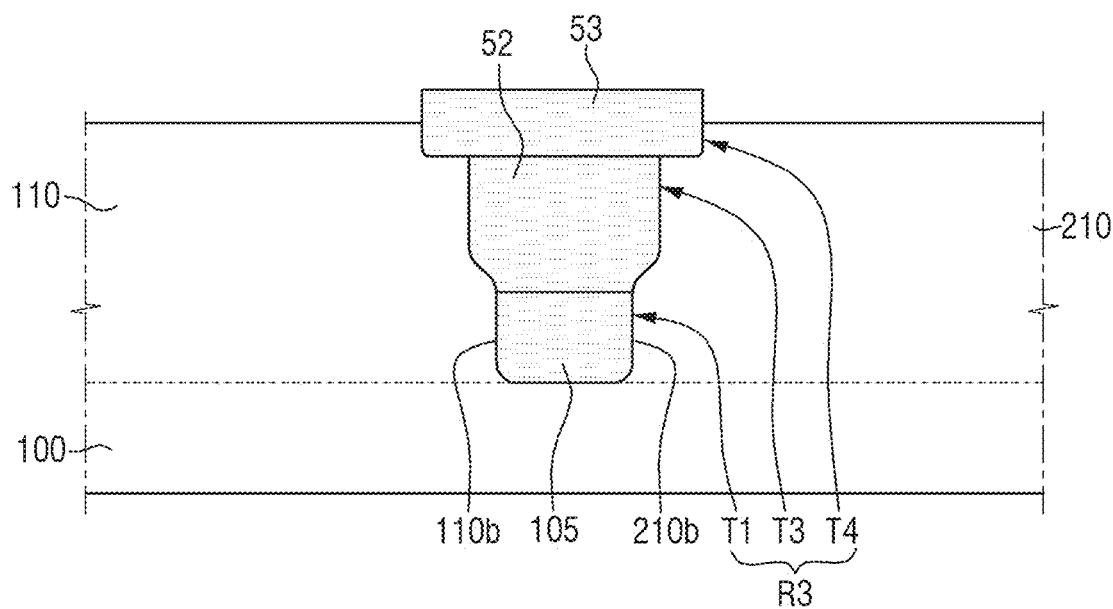

Referring to FIG. 24, the second mask pattern 32 may be removed.

The top surfaces of the first and second fin-type patterns 110 and 210 may be exposed by the removal of the second mask pattern 32.

Thus, the third insulating layer 53 may protrude above the top surfaces of the first and second fin-type patterns 110 and 210.

Figure 25:
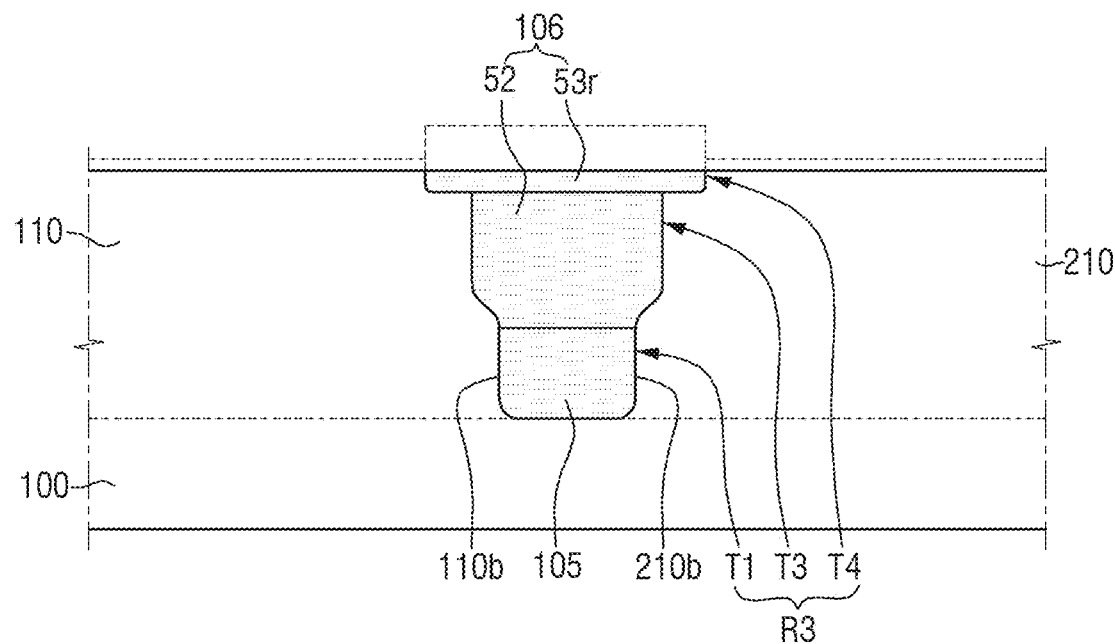

Referring to FIG. 25, at least a portion of the third insulating layer 53 protruding above the top surfaces of the first and second fin-type patterns 110 and 210 may be removed to form a recessed third insulating layer 53r. The first and second fin-type patterns 110 and 210 may be partially removed while removing at least the portion of the third insulating layer 53.

Thus, an insulating pattern 106 may be formed on the first field insulating layer 105. The insulating pattern 106 may include the second insulating layer 52 and the recessed third insulating layer 53r.

The first field insulating layer 105 and the insulating pattern 106 which are sequentially stacked on the substrate 100 may be formed between the first fin-type pattern 110 and the second fin-type pattern 210.

Figure 26:
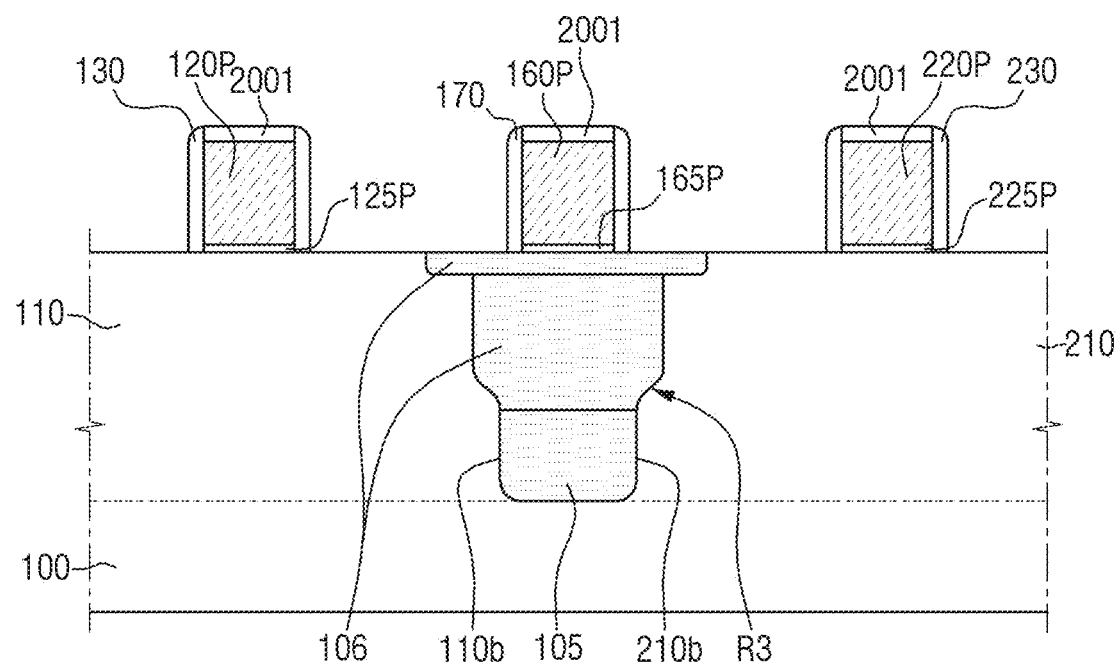

Referring to FIG. 26, a first dummy gate electrode 120p, a second dummy gate electrode 220p, and a third dummy gate electrode 160p may be formed.

The first dummy gate electrode 120p may extend in the second direction Y1 (refer to FIG. 1) and may be formed on the first fin-type pattern 110. A first dummy gate insulating layer 125p may be formed between the first dummy gate electrode 120p and the first fin-type pattern 110.

The second dummy gate electrode 220p may extend in the second direction Y1 and may be formed on the second fin-type pattern 210. A second dummy gate insulating layer 225p may be formed between the second dummy gate electrode 220p and the second fin-type pattern 210.

The third dummy gate electrode 160p may extend in the second direction Y1 and may be formed between the first fin-type pattern 110 and the second fin-type pattern 210. The third dummy gate electrode 160p may be formed on the insulating pattern 106 between the short sides 110b and 210b of the first and second fin-type patterns 110 and 210 which face each other. The third dummy gate electrode 160p may be between the first fin-type pattern 110 and the second fin-type pattern 210.

A first spacer 130 may be formed on sidewalls of the first dummy gate electrode 120p, a second spacer 230 may be formed on sidewalls of the second dummy gate electrode 220p, and a third spacer 170 may be formed on sidewalls of the third dummy gate electrode 160p.

A gate hard mask pattern 2001 may be formed on top surfaces of the first through third dummy gate electrodes 120p, 22op, and 160p.

Figure 27:
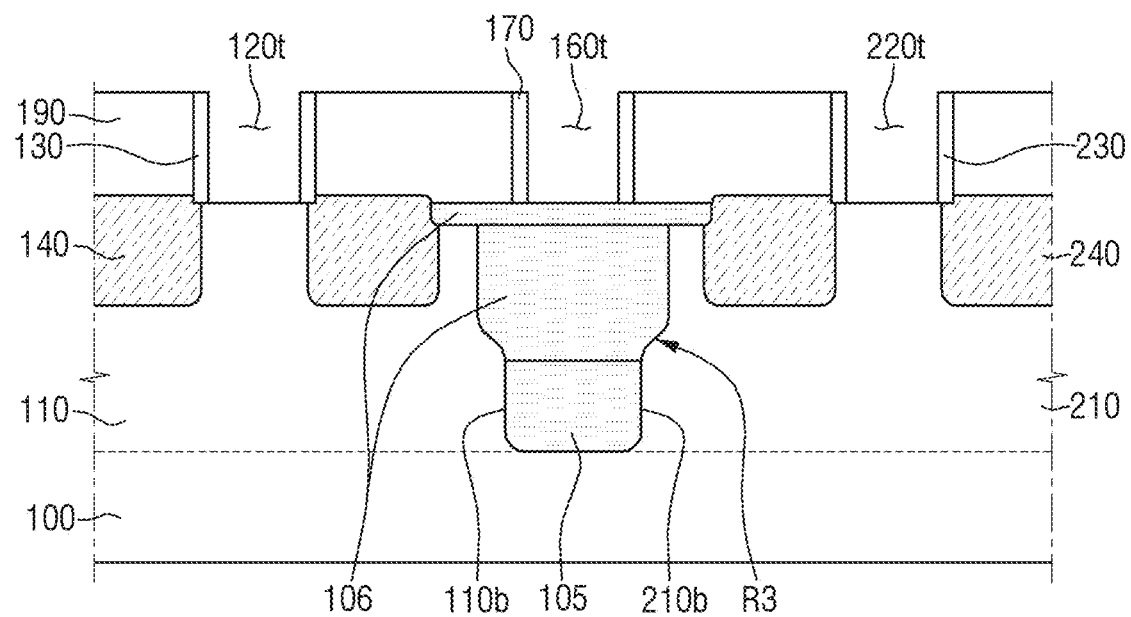

Referring to FIG. 27, a first epitaxial pattern 140 may be formed on the first fin-type pattern 110 at opposite sides of the first dummy gate electrode 120p, and the second epitaxial pattern 240 may be formed on the second fin-type pattern 210 at opposite sides of the second dummy gate electrode 220p.

The insulting pattern 106 may be disposed between the first epitaxial pattern 140 positioned at an end potion of the first fin-type pattern 110 and the second epitaxial pattern 240 positioned at an end portion of the second fin-type pattern 210.

A semiconductor pattern (e.g., a portion of the first fin-type pattern 110) may be interposed between the first epitaxial pattern 140 and the insulating pattern 106. A semiconductor pattern (e.g., a portion of the second fin-type pattern 210) may be interposed between the second epitaxial pattern 240 and the insulating pattern 106.

An interlayer insulating layer 190 may be formed on the substrate 100 to cover the first and second fin-type patterns 110 and 210 and the first through third dummy gate electrodes 120p, 22op, and 160p.

The interlayer insulating layer 190 may be planarized until the top surfaces of the first through third dummy gate electrodes 120p, 220p, and 160p are exposed. Thus, the gate hard mask pattern 2001 may be removed.

The first through third gate dummy gate electrodes 120p, 220p, and 160p and the first through third dummy gate insulating layers 125p, 225p, and 165p may be removed.

According to the removal of the third dummy gate electrode 160p and the third dummy gate insulating layer 165p, a first gate trench 160t may be formed on the insulating pattern 106 and may be defined by the third spacer 170.

According to the removal of the first dummy gate electrode 120p and the first dummy gate insulating layer 125p, a second gate trench 120t may be formed to expose the first fin-type pattern 110 and may be defined by the first spacer 130.

According to the removal of the second dummy gate electrode 220p and the second dummy gate insulating layer 225p, a third gate trench 220t may be formed to expose the second fin-type pattern 210 and may be defined by the second spacer 230.

Figure 28:
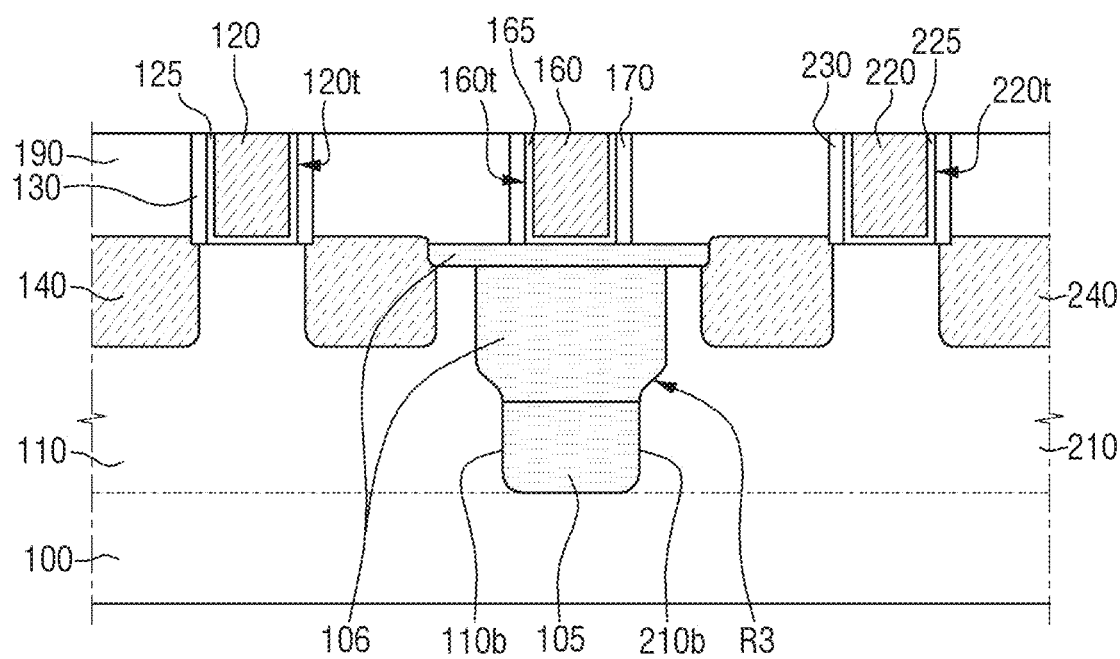

Referring to FIG. 28, a first gate insulating layer 125, a second gate insulating layer 225, and a conductive pattern liner 165 may be formed in the second gate trench 120t, the third gate trench 220t, and the first gate trench 160t, respectively.

A first gate electrode 120 may be formed to fill the second gate trench 120t, a second gate electrode 220 may be formed to fill the third gate trench 220t, and a conductive pattern 160 may be formed to fill the first gate trench 160t.

FIGS. 29 through 38 are cross-sectional views illustrating stages of a method of manufacturing a semiconductor device according to some example embodiments of the inventive concepts.

Figure 29:
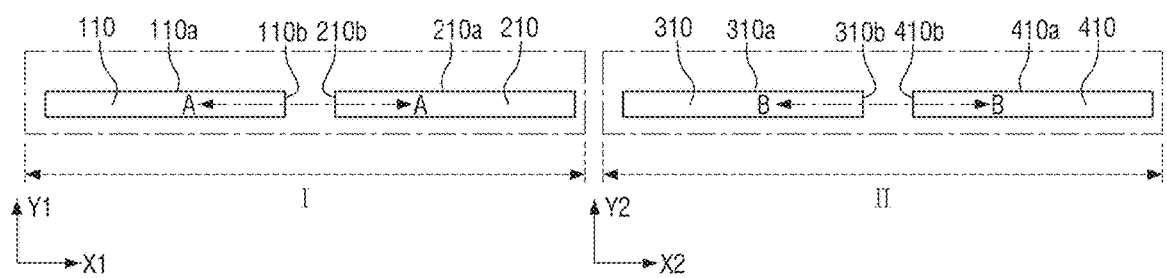
FIGS. 29 through 38 illustrate stages of a method of fabricating a semiconductor device according to some example embodiments of the inventive concepts.
Figure 30:
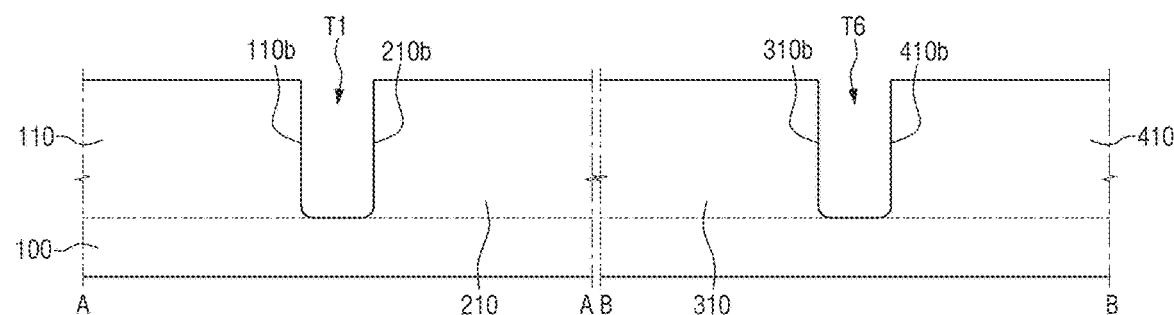

FIG. 30 is a cross-sectional view taken along lines A-A and B-B of FIG. 29. Furthermore, since elements in a first region I are the same as those described with reference to FIGS. 1 through 28, descriptions thereto will be described briefly.

Referring to FIGS. 29 and 30, the first fin-type pattern 110 and the second fin-type pattern 210 may be formed on the substrate 100 of the first region I and may be lengthwise extend in the first direction X1. A third fin-type pattern 310 and a fourth fin-type pattern 410 may be formed on the substrate 100 of a second region II and may lengthwise extend in a third direction X2.

The substrate 100 may include the first region I and the second region II. The first and second regions I and II may be separated from each other or may be connected to each other.

A first transistor may be formed in the first region I and a second transistor may be formed in the second region II. The first transistor and the second transistor may have different conductive types from each other. For example, the first region I may be an NMOS region in which the first transistor as an NMOS transistor is formed and the second region II may be a PMOS region in which the second transistor as a PMOS transistor is formed. Alternatively, the first region I may be a PMOS region in which the first transistor as a PMOS transistor is formed and the second region II may be an MNOS region in which the second transistor as an NMOS transistor is formed.

Hereinafter, it will be described that the first region I is the NMOS region and the second region II is the PMOS region.

The first and second fin-type patterns 110 and 210 may be arranged in a line in the first direction X1. The first and second fin-type patterns 110 and 210 may be arranged in a length direction thereof to be adjacent to each other.

The first and second fin-type patterns 110 and 210 may be separated from each other by the separation trench T1.

The third and fourth fin-type patterns 310 and 410 may be arranged in a line in the third direction X2. The third direction X2 may be parallel to the first direction X1, but not limited thereto.

The third and fourth fin-type patterns 310 and 410 may be arranged in a length direction thereof and may be adjacent to each other.

A long sidewall 310a of the third fin-type pattern 310 and a long sidewall 410a of the fourth fin-type pattern 410 may extend in a third direction X2. An short side 310b of the third fin-type pattern 310 and an short side 410b of the fourth fin-type pattern 410 may extend in a fourth direction Y2 and may face each other.

The fourth direction Y2 may be perpendicular to the third direction X2.

A sixth separation trench T6 may be formed between the third fin-type pattern 310 and the fourth fin-type pattern 410 to separate the third and fourth fin-type patterns 310 and 410. The sixth separation trench T6 may be formed to contact the short sides 310b and 410b of the third and fourth fin-type patterns 310 and 410.

Hereinafter, it will be described based on cross-sectional views taken along lines A-A and B-B of FIG. 29.

Figure 31:
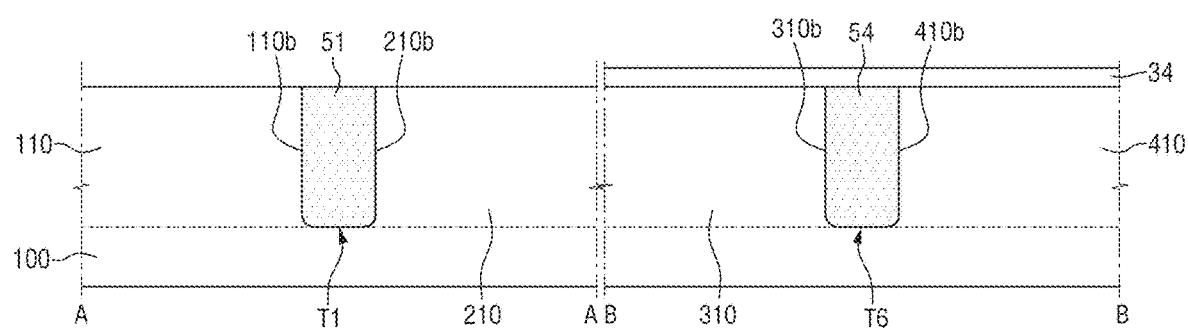

Referring to FIG. 31, the first insulating layer 51 may be formed to fill the first separation trench T1.

A fourth insulating layer 54 may be formed to fill the sixth separation trench T6. The first and fourth insulating layers 51 and 54 may be formed concurrently, but not limited thereto.

A third mask pattern 34 may be formed in the second region II. The third mask pattern 34 may cover the third and fourth fin-type patterns 310 and 410 and the fourth insulating layer 54.

The first and second fin-type patterns 110 and 210 and the first insulating layer 51 may be exposed by the third mask pattern 34.

Figure 32:
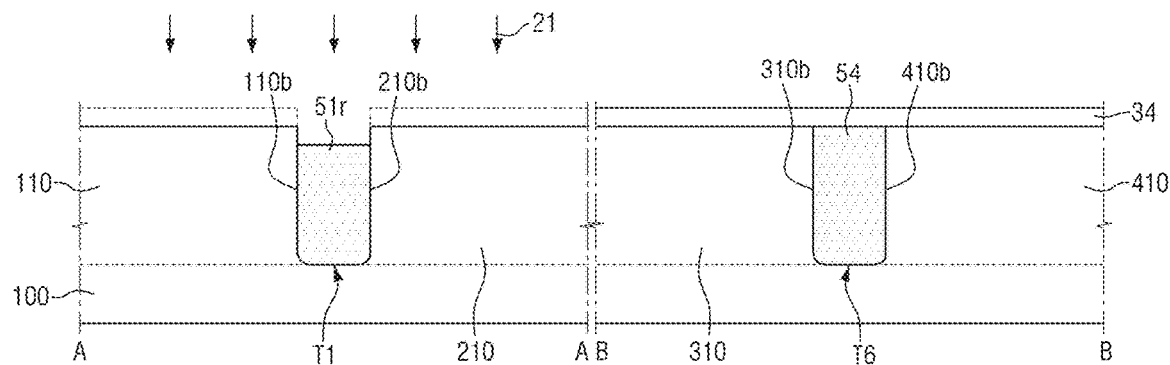
Figure 33:
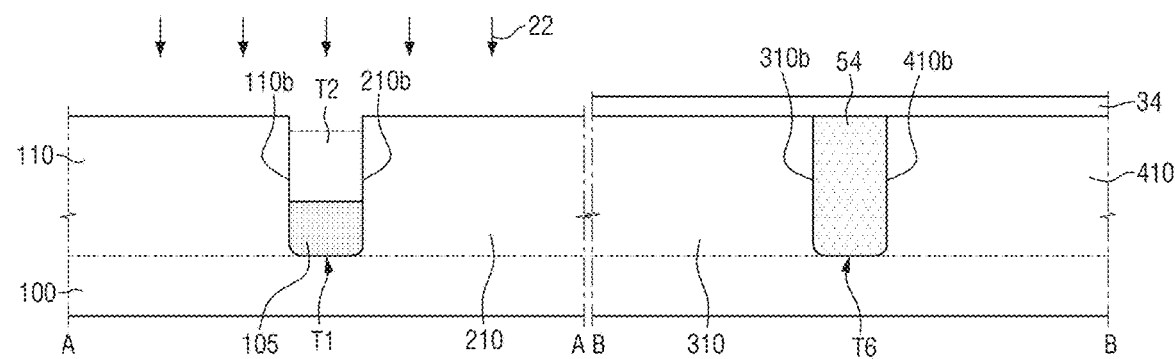

Referring to FIGS. 32 and 33, the second separation trench T2 may be formed by removing a portion of the first insulating layer 51.

The remaining portion of the first insulating layer 51 may be disposed in the first separation trench T1 and the removed portion of the first insulating layer 51 may be the second separation trench T2. The remaining portion of the first insulating layer 51 may be the first field insulating layer 105.

The first insulating layer 51 may be partially removed in a state in which the top surfaces of the first and second fin-type patterns 110 and 210 are exposed. The first insulating layer 51 may be partially removed by sequentially performing the first etching process and the second etching process.

The first insulating layer 51 may be partially removed by the same manner as those described with reference to FIGS. 5 and 6.

Figure 34:
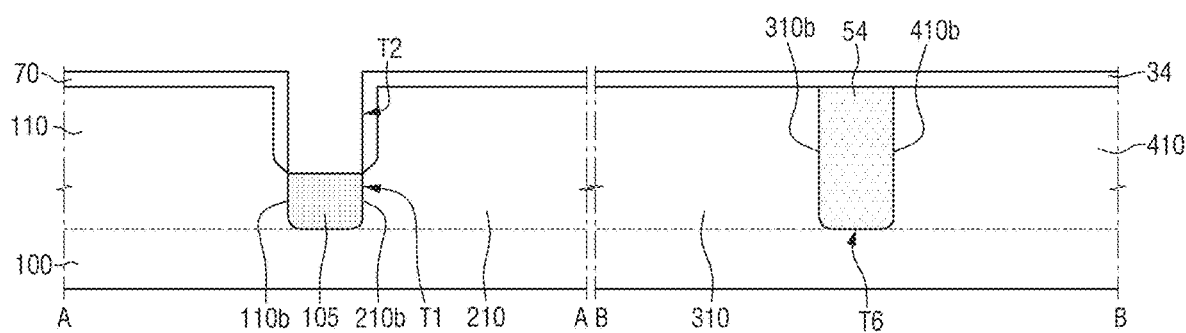

Referring to FIG. 34, the first oxide layer 70 may be formed by oxidizing a portion of each or at least one of the first and second fin-type patterns 110 and 210 exposed by the second separation trench T2.

The first oxide layer 70 may be formed by oxidizing a portion of the first fin-type pattern 110 and a portion of the second fin-type pattern 210 which are exposed by the first filed insulating layer 105. The first oxide layer 70 may be formed on the sidewall of the second separation trench T2.

Figure 35:
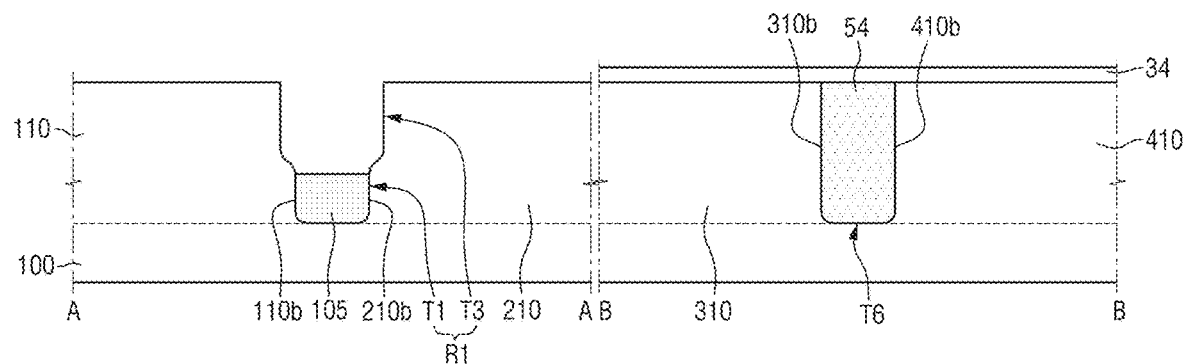

Referring FIG. 35, the first oxide layer 70 may be removed to form the third separation trench T3 on the first insulating layer 105.

The width of the third separation trench T3 may be greater than the width of the second separation trench T2. The third separation trench T3 may be formed by enlarging the width of the second separation trench T3.

The first recess R1 may be formed between the first fin-type pattern 110 and the second fin-type pattern 210 by removing the first oxide 70. The first recess R1 may include the first separation trench T1 and the third separation trench T3.

Figure 36:
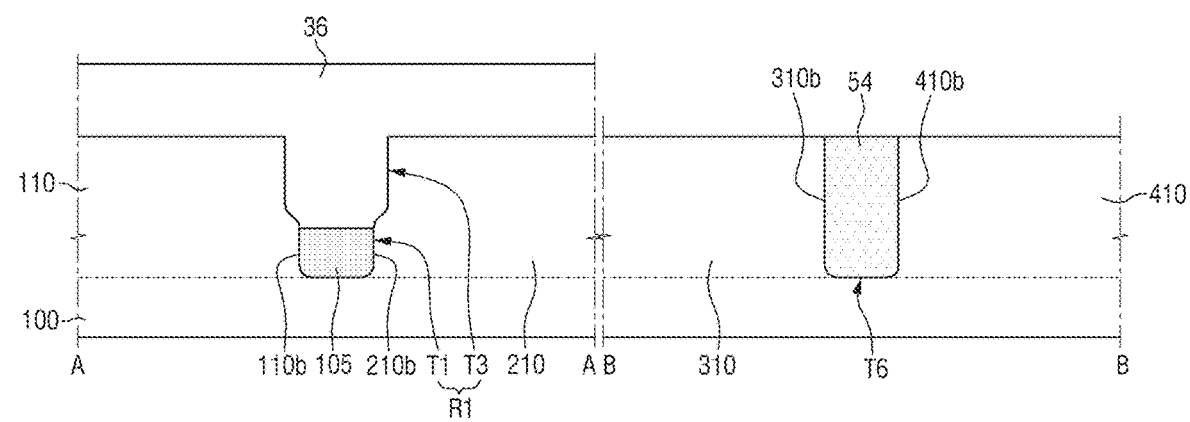

Referring to FIG. 36, the third mask pattern 34 in the second region II may be removed.

A fourth mask pattern 36 may be formed in the first region I. The fourth mask pattern 36 may cover the first and second fin-type patterns 110 and 210 and the first field insulating layer 105.

The fourth mask pattern 36 may be formed in the first recess R1.

The third and fourth fin-type patterns 310 and 410 and the fourth insulating layer 54 in the second region II may be exposed by the fourth mask pattern 36.

Figure 37:
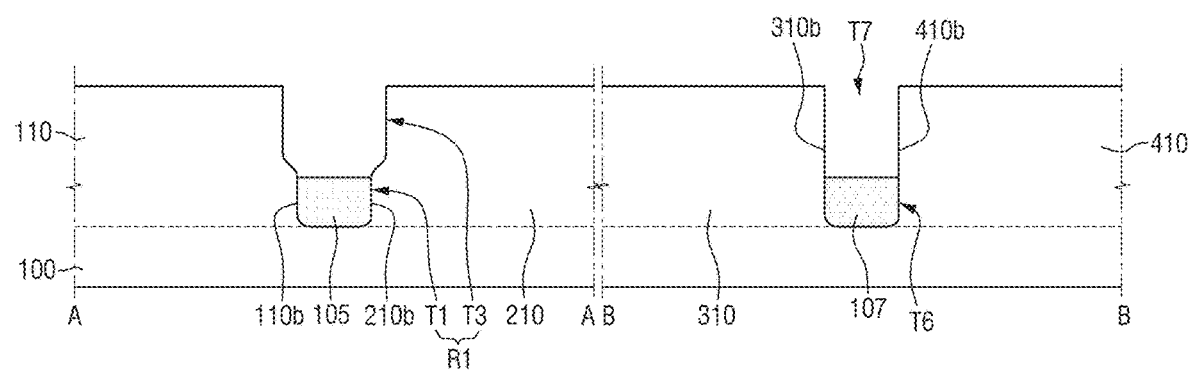

Referring to FIG. 37, a seventh separation trench T7 may be formed by removing a portion of the fourth insulating layer 54. The seventh separation trench T7 may be defined by a sidewall (e.g., short side 310b) of the third fin-type pattern 310, a sidewall (e.g., short side 410b) of the fourth fin-type pattern 410, and a remaining portion of the fourth insulating layer 54.

In accordance with the formation of the seventh separation trench T7, a second field insulating layer 107 may be formed between the third fin-type pattern 310 and the fourth fin-type pattern 410. The remaining portion of the fourth insulating layer 54 may be the second field insulating layer 107.

The second field insulating layer 107 may be formed between the short side 310b of the third fin-type pattern 310 and the short side 410b of the fourth fin-type pattern 410. The second field insulating layer 107 may expose a portion of a sidewall (e.g., a portion of the short side 310b) of the third fin-type pattern 310 and a portion of a sidewall (e.g., a portion of the short side 410b) of the fourth fin-type pattern 410.

The fourth mask pattern 36 may be removed.

Figure 38:
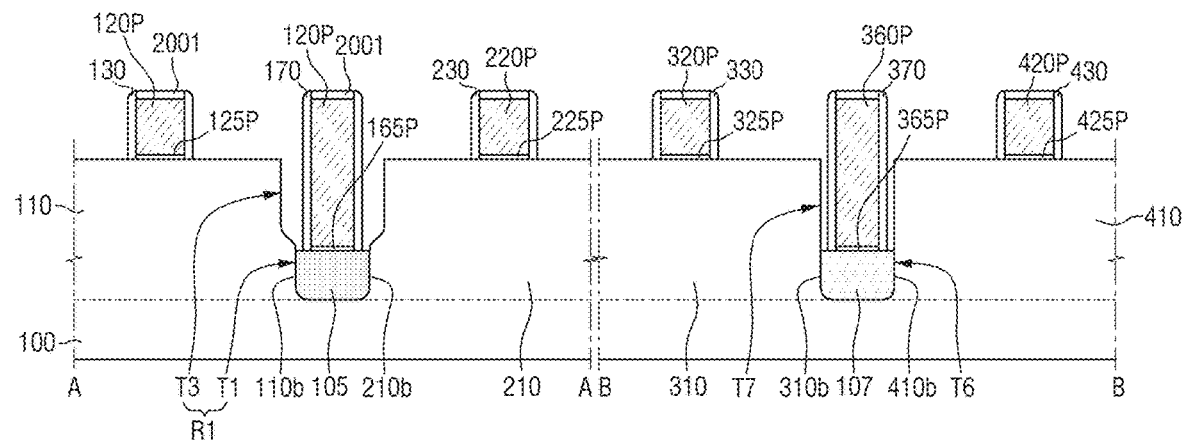

Referring to FIG. 38, by performing an etching process using the gate hard mask pattern 2001 as an etch mask, the first through third dummy gate electrodes 120p, 220p, and 160P may be formed in the first region I and fourth through sixth dummy gate electrodes 320p, 420p, and 360p may be formed in the second region II.

The first dummy gate insulating layer 125p may be formed between the first fin-type pattern 110 and the first dummy gate electrode 120p, and the second dummy gate insulating layer 225p may be formed between the second fin-type pattern 210 and the second dummy gate electrode 220p.

The third dummy gate electrode 160p may be formed on the field insulating layer 105 which is formed between the short side 110b of the first fin-type pattern 110 and the short side 210b of the second fin-type pattern 210. The third dummy gate electrode 160p may be (or extend in the second direction Y1) between the first and second fin-type patterns 110 and 210.

The third dummy gate electrode 160p may be formed in the first recess R1. For example, the third dummy gate electrode 160p may be formed in the third separation trench T3.

The third dummy gate insulating layer 165p may be formed between the first field insulating layer 105 and the third dummy gate electrode 160p, but not limited thereto.

A fourth dummy gate insulating layer 325p may be formed between the third fin-type pattern 310 and the fourth dummy gate electrode 320p, and a fifth dummy gate insulating layer 425p may be formed between the fourth fin-type pattern 410 and the fifth dummy gate electrode 420p.

The sixth dummy gate electrode may be formed on the second field insulating layer 107 between the short side 310b of the third fin-type pattern 310 and the short side 410b of the fourth fin-type pattern 410. The sixth dummy gate electrode 360p may be (or extend in the fourth direction Y2) between the third fin-type pattern 310 and the fourth fin-type pattern 410. The second direction Y2 may be parallel to the fourth direction Y2, but not limited thereto.

The sixth dummy gate electrode 360p may be formed in the seventh separation trench T7.

A sixth dummy gate insulating layer 365p may be formed between the sixth dummy gate electrode 360p and the second field insulating layer 107, but not limited thereto.

Next, a gate replacement process may be performed to form a first gate electrode on the first fin-type pattern 110, a second gate electrode on the second fin-type pattern 210, and a first conducive pattern on the first field insulating layer 105 in the first region I and a third gate electrode on the third fin-type pattern 310, a fourth gate electrode on the fourth fin-type pattern 410, and a second conducive pattern on the second field insulating layer 107 in the first region I.

The first and second gate electrodes may extend in the second direction Y1. The third and fourth gate electrodes may extend in the fourth direction Y2. The first conductive pattern in the first region I may be (or extend in the second direction Y1) between the first fin-type pattern 110 and the second fin-type pattern 210, and the second conductive pattern in the second region II may be (or extend in the fourth direction Y2) between the third fin-type pattern 310 and the fourth fin-type pattern 410.

In addition, a first gate insulating layer may be formed between the first gate electrode and the first fin-type pattern 110 and the second gate insulating layer may be formed between the second gate electrode and the second fin-type pattern 210, the first conductive pattern liner may be formed between the first conductive pattern and the first field insulating layer 105.

A third gate insulating layer may be formed between the third gate electrode and the third fin-type pattern 310 and the fourth gate insulating layer may be formed between the fourth gate electrode and the fourth fin-type pattern 410, the second conductive pattern liner may be formed between the second conductive pattern and the second field insulating layer 107.

FIGS. 39 through 43 illustrate stages of a method of fabricating a semiconductor device according to some example embodiments of the inventive concepts.

Figure 39:
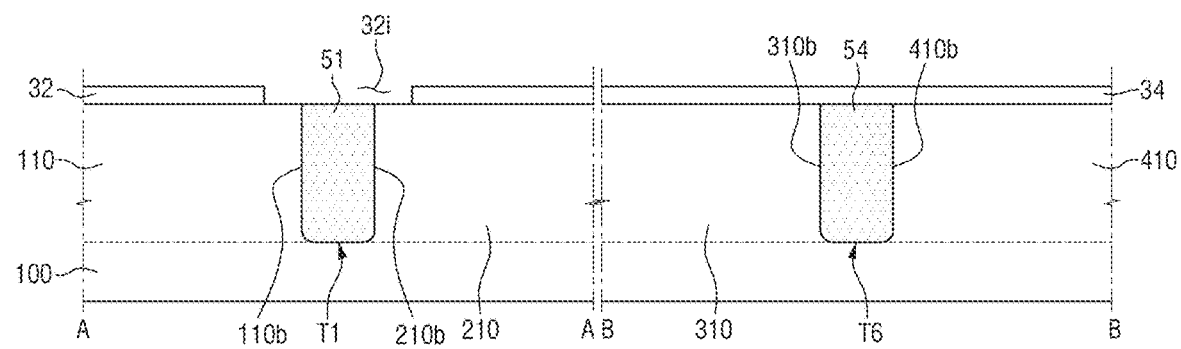
FIGS. 39 through 43 illustrate stages of a method of fabricating a semiconductor device according to some example embodiments of the inventive concepts.

Referring to FIG. 39, the first insulating layer 51 may be formed to fill the first separation trench T1. The fourth insulating layer 54 may be formed to fill the sixth separation trench T6.

The third mask pattern 34 may be formed in the second region II to cover the third and fourth fin-type patterns 310 and 410 and the fourth insulating layer 54.

Further, the second mask pattern 32 having the second opening 32i therein may be formed on the first fin-type pattern 110, the second fin-type pattern 210, and the first insulating layer 51, in the first region I.

The second mask pattern 32 and the third mask pattern 34 may be formed concurrently, or may be formed through different processes.

Figure 40:
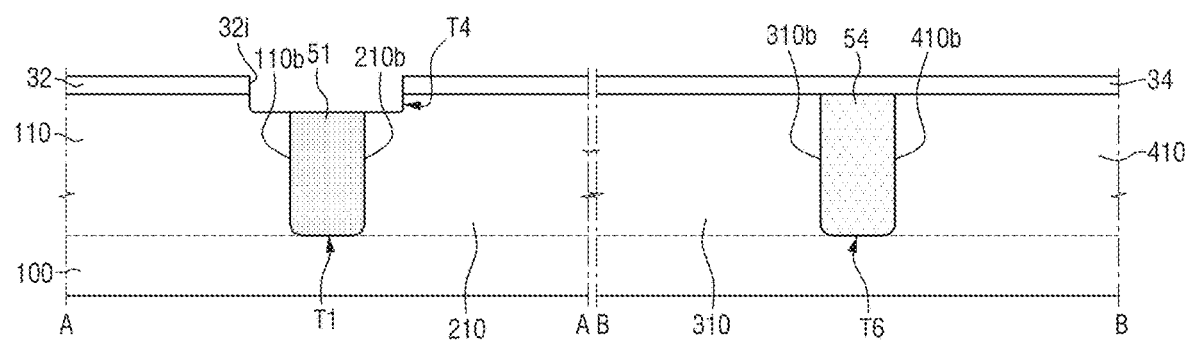
Figure 41:
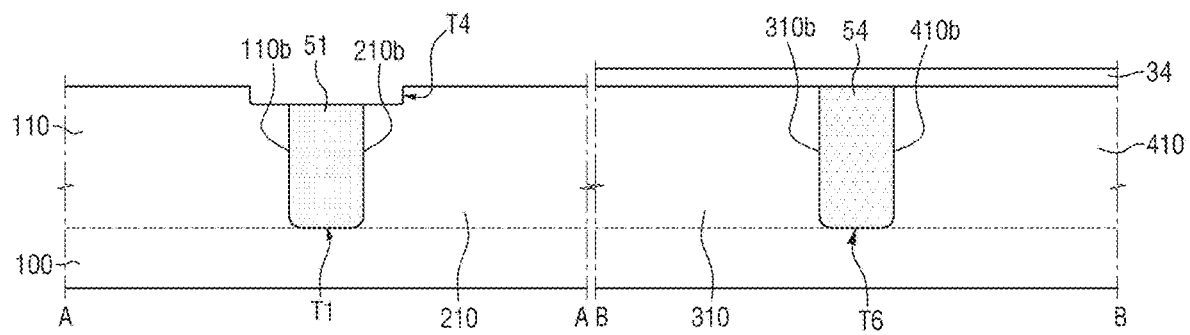

Referring to FIGS. 40 and 41, a portion of the first fin-type pattern 110 and a portion of the second fin-type pattern 210 may be removed using the second mask pattern as an etch mask to form the fourth separation trench T4.

The fourth separation trench T4 may be formed by recessing a portion of the top surface of the first fin-type pattern 110, a portion of the top surface of the second fin-type pattern 210, and the top surface of the first insulating layer 51.

The second mask pattern 32 may be removed to expose the top surfaces of the first and second fin-type patterns 110 and 210.

Figure 42:
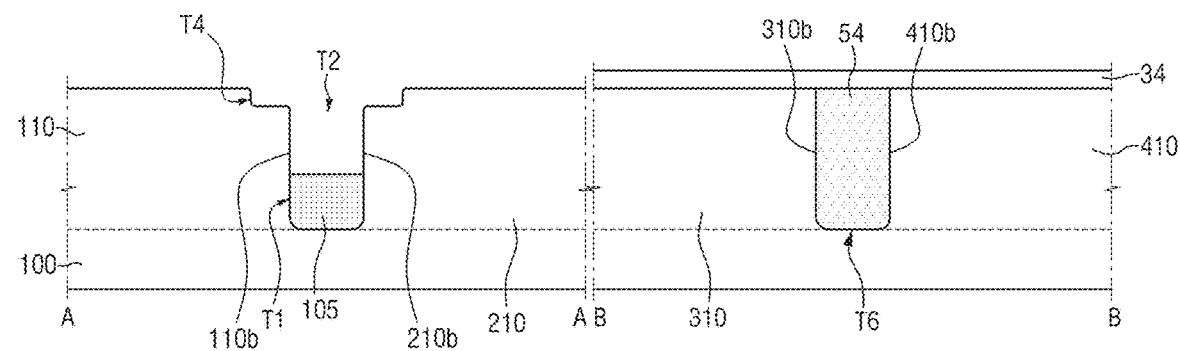

Referring to FIG. 42, the second trench T2 may be formed by removing a portion of the first insulating layer 51 in a state in which the top surfaces of the first and second fin-type patterns 110 and 210 are exposed.

In accordance with the formation of the second separation trench T2, the first field insulating layer 105 may be formed between the first fin-type pattern 110 and the second fin-type pattern 210.

Figure 43:
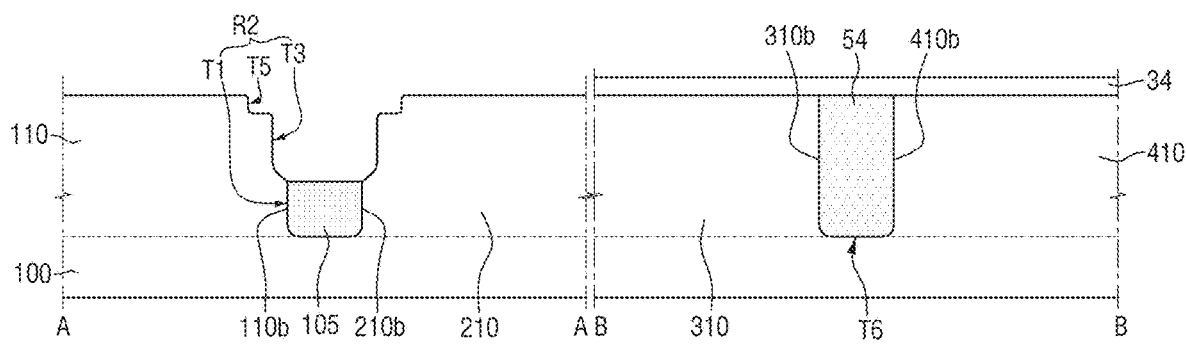

Referring to FIG. 43, the second oxide layer 72 (refer to FIG. 20) may be formed by oxidizing a portion of the first fin-type pattern 110 and a portion of the second fin-type pattern 210 exposed by the second and fourth separation trenches T2 and T4, and then the second oxide layer 72 may be removed to form the third separation trench T3 and the fifth separation trench T5.

Next, the second field insulating layer 107 may be formed between the third fin-type pattern 310 and the fourth fin-type pattern 410 using the processes as described with reference to FIGS. 36 and 37.

Figure 44:
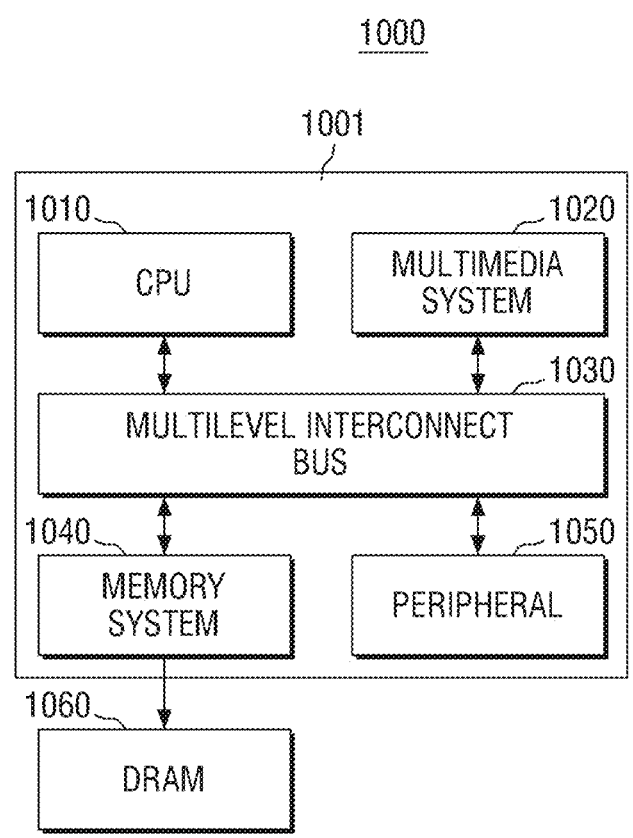
FIG. 44 is a block diagram of a system on chip (SoC) including semiconductor devices fabricated by methods according to some example embodiments of the inventive concepts.

FIG. 44 is a block diagram of a system on chip (SoC) including semiconductor devices fabricated by methods according to some example embodiments of the inventive concepts.

Referring to FIG. 44, the SoC 1000 may include application processor 1001 and DRAM 1060.

The application processor 1001 may include a central processing unit 1010, a multimedia system 1020, a bus 1030, a memory system 1040, and a peripheral circuit 1050.

The central processing unit 1010 may perform operations necessary for operating the SoC 1000. In some example embodiments, the central processing unit 1010 may be configured in a multi-core environment including a plurality of cores.

The multimedia system 1020 may be used in performing a variety of multimedia functions in the SoC 1000. The multimedia system 1020 may include a 3D engine module, a video codec, a display system, a camera system, and a post-processor.

The bus 1030 may be used in performing data communication among the central processing unit 1010, the multimedia system 1020, the memory system 1040, and the peripheral circuit 1050. In some example embodiments, the bus 1030 may have a multi-layered structure. In detail, examples of the bus 1030 may include a multi-layer advanced high-performance bus (AHB), or a multi-layer advanced eXtensible interface (AXI), but example embodiments of the inventive concepts are not limited thereto.

The memory system 1040 may provide environments necessary for high-speed operation by connecting the AP 1001 to an external memory (for example, the DRAM 1060). In some example embodiments, the memory system 1040 may include a separate controller (for example, a DRAM controller) for controlling the external memory (for example, the DRAM 1060).

The peripheral circuit 1050 may provide environments necessary for smoothly connecting the SoC 1000 to an external device (for example, a main board). Accordingly, the peripheral circuit 1050 may include various kinds of interfaces enabling the external device connected to the SoC system 1000 to be compatibly used.

The DRAM 1060 may function as a working memory required to operate the AP 1001. In some example embodiments, as shown, the DRAM 1060 may be disposed outside the AP 1001. In detail, the DRAM 1060 may be packaged with the AP 1001 in the form of a package on package (PoP). Each or at least one of the central processing unit 1010, the multimedia system 1020, the memory system 1040, the peripheral circuit 1050 and DRAM 1060 may be embodied by one or more semiconductor devices manufactured by the methods described herein according to some example embodiments.

While the inventive concepts has been particularly shown and described with reference to some example embodiments thereof, it will be understood by those of ordinary skill in the art that various changes in form and details may be made therein without departing from the spirit and scope of the example embodiments as defined by the following claims.

What is claimed is:

1. A semiconductor device, comprising:
a first fin-type pattern and a second fin-type pattern which are separated from each other by a first recess, the first recess including a first trench having a first width, a second trench having a second width greater than the first width and a connection portion between the first and second trench, and the connection portion being rounded;
an insulating pattern in the first recess;
a first epitaxial pattern at an end portion of the first fin-type pattern;
a second epitaxial pattern at an end portion of the second fin-type pattern;
an insulating protrusion pattern on the insulating pattern, between the first epitaxial pattern and the second epitaxial pattern; and
a conductive pattern on the insulating protrusion pattern and covering the insulating protrusion pattern,
wherein a bottom layer of the insulating protrusion pattern is lower than a bottom layer of the first epitaxial pattern, wherein a portion of a side surface of the conductive pattern faces a side surface of the insulating protrusion pattern, and wherein at least one of the first epitaxial pattern and the second epitaxial pattern has a plurality of sloped surfaces.

2. A semiconductor device, comprising:
a first fin-type pattern and a second fin-type pattern which are separated from each other by a first recess, the first recess including a first trench having a first width, a second trench having a second width greater than the first width, a third trench having a third width greater than the second width and a connection portion between the first and second trenches, the second trench being connected to the first trench and the third trench, and the connection portion being rounded;
an insulating pattern in the first recess;
a first epitaxial pattern at an end portion of the first fin-type pattern;
a second epitaxial pattern at an end portion of the second fin-type pattern; and
an insulating protrusion pattern on the insulating pattern, between the first epitaxial pattern and the second epitaxial pattern,
wherein a bottom layer of the insulating protrusion pattern is lower than a bottom layer of the first epitaxial pattern.

3. The semiconductor device of claim 1, wherein a height of an upper layer of the insulating protrusion pattern is different from a height of an upper layer of the first and second epitaxial pattern.

4. The semiconductor device of claim 1, wherein a height of an upper layer of the insulating protrusion pattern is identical with a height of an upper layer of the first and second fin-type pattern.

5. The semiconductor device of claim 1, wherein both of the first epitaxial pattern and the second epitaxial pattern have a plurality of sloped surfaces.

6. The semiconductor device of claim 1, wherein a height of a bottom layer of the conductive pattern is less than a height of a bottom layer of the first and second epitaxial pattern.

* * * * *